(12) United States Patent
Huang et al.

(10) Patent No.: US 9,153,695 B2
(45) Date of Patent: Oct. 6, 2015

(54) FIN-LAST FINFET AND METHODS OF FORMING SAME

(71) Applicant: Taiwan Semiconductor Manufacturing Company, Ltd., Hsin-Chu (TW)

(72) Inventors: Yu-Lien Huang, Jhubei (TW); Clement Hsingjen Wann, Carmel, NY (US); Ming-Huan Tsai, Zhubei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/330,970

(22) Filed: Jul. 14, 2014

(65) Prior Publication Data

US 2014/0327046 A1    Nov. 6, 2014

Related U.S. Application Data

(62) Division of application No. 13/689,346, filed on Nov. 29, 2012, now Pat. No. 8,809,139.

(51) Int. Cl.
*H01L 27/12* (2006.01)
*H01L 29/78* (2006.01)
(Continued)

(52) U.S. Cl.
CPC ...... *H01L 29/785* (2013.01); *H01L 21/823807* (2013.01); *H01L 21/823814* (2013.01); *H01L 21/823821* (2013.01); *H01L 27/0924* (2013.01); *H01L 29/1054* (2013.01); *H01L 29/16* (2013.01); *H01L 29/165* (2013.01);
(Continued)

(58) Field of Classification Search
USPC ........................................................ 257/350
See application file for complete search history.

(56) References Cited

U.S. PATENT DOCUMENTS 7,579,248 B2    8/2009  Huang et al.
2006/0113591 A1  6/2006  Wan et al.
(Continued)

FOREIGN PATENT DOCUMENTS

TW    201114039    4/2011
TW    201115626    5/2011
(Continued)

OTHER PUBLICATIONS

Fitzgerald, E.A. et al., "MOSFET Channel Engineering using Strained Si, SiGe, and Ge Channels," MIT, Department of Materials Science and Engineering, Jan. 2003, 1 page.
(Continued)

*Primary Examiner* — Asok K Sarkar
(74) *Attorney, Agent, or Firm* — Slater & Matsil, L.L.P.

(57) ABSTRACT

Embodiments of the present disclosure are a FinFET device, and methods of forming a FinFET device. An embodiment is a method for forming a FinFET device, the method comprising forming a semiconductor strip over a semiconductor substrate, wherein the semiconductor strip is disposed in a dielectric layer, forming a gate over the semiconductor strip and the dielectric layer, and forming a first recess and a second recess in the semiconductor strip, wherein the first recess is on an opposite side of the gate from the second recess. The method further comprises forming a source region in the first recess and a drain region in the second recess, and recessing the dielectric layer, wherein a first portion of the semiconductor strip extends above a top surface of the dielectric layer forming a semiconductor fin.

22 Claims, 24 Drawing Sheets

(51) Int. Cl.

| | | |
|---|---|---|
| *H01L 29/66* | (2006.01) | |
| *H01L 21/8238* | (2006.01) | |
| *H01L 27/092* | (2006.01) | |
| *H01L 29/16* | (2006.01) | |
| *H01L 29/165* | (2006.01) | |
| *H01L 29/10* | (2006.01) | |

(52) U.S. Cl.
CPC .... *H01L29/66477* (2013.01); *H01L 29/66545* (2013.01); *H01L 29/66795* (2013.01); *H01L 29/7848* (2013.01)

(56) References Cited

U.S. PATENT DOCUMENTS

| | | | |
|---|---|---|---|
| 2007/0004133 | A1 | 1/2007 | Kim et al. |
| 2009/0061586 | A1 | 3/2009 | Yu et al. |
| 2011/0291189 | A1 | 12/2011 | Cheng et al. |
| 2013/0270628 | A1 | 10/2013 | Huang et al. |
| 2014/0027816 | A1 | 1/2014 | Cea et al. |
| 2014/0070328 | A1* | 3/2014 | Goto et al. .................. 257/401 |
| 2014/0077229 | A1* | 3/2014 | Liu et al. ..................... 257/77 |

FOREIGN PATENT DOCUMENTS

| | | |
|---|---|---|
| TW | 201137985 | 11/2011 |
| TW | 201242022 | 10/2012 |

OTHER PUBLICATIONS

Hashemi, P. et al., "Ultrathin Strained-Ge Channel P-MOSFETs With High-K/Metal Gate and Sub-1-nm Equivalent Oxide Thickness," IEEE Electron Device Letters, vol. 33, Issue 7, Jul. 2012, pp. 943-945.

Liao, W.S. et al., "PMOS Hole Mobility Enhancement Through SiGe Conductive Channel and Highly Compressive ILD-SiNx Stressing Layer," IEEE Electron Device Letters, vol. 29, No. 1, Jan. 2008, pp. 86-88.

Shi, Z. et al., "Mobility Enhancement in Surface Channel SiGe PMOSFETs with HfO2 Gate Dielectrics," IEEE Electron Device Letters, vol. 24, No. 1, Jan. 2003, pp. 34-36.

Verdonckt-Vandebroek, S. et al., "High-Mobility Modulation-Doped Graded SiGe-Channel p-MOSFET's," IEEE Electron Device Letters, vol. 12. No. 8, Aug. 1991, pp. 447-449.

Xia, G., "Site and Stress Technology for CMOS and Beyond," UBC, Materials Engineering, MiNA Microsystems and Nanotechnology Group, Sep. 15, 2009, 35 pages.

* cited by examiner

FIN-LAST FINFET AND METHODS OF FORMING SAME

PRIORITY CLAIM AND CROSS-REFERENCE

This application is a continuation of U.S. patent application Ser. No. 13/689,346, filed Nov. 29, 2012, titled "Fin-Last FinFET and Methods of Forming Same," which application is incorporated herein by reference in its entirety.

BACKGROUND

The cost and complexity associated with scaling of semiconductor device sizes according to Moore's law has given rise to new methods to improve semiconductor device characteristics. New gate materials such as high-k gate dielectrics and metal gates to decrease device leakage, FinFET devices with increased effective gate area as compared to same-size planar devices, and strain inducing channels for increased charge carrier mobility are a few examples of methods to continue Moore's Law scaling for next generation microprocessor designs.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
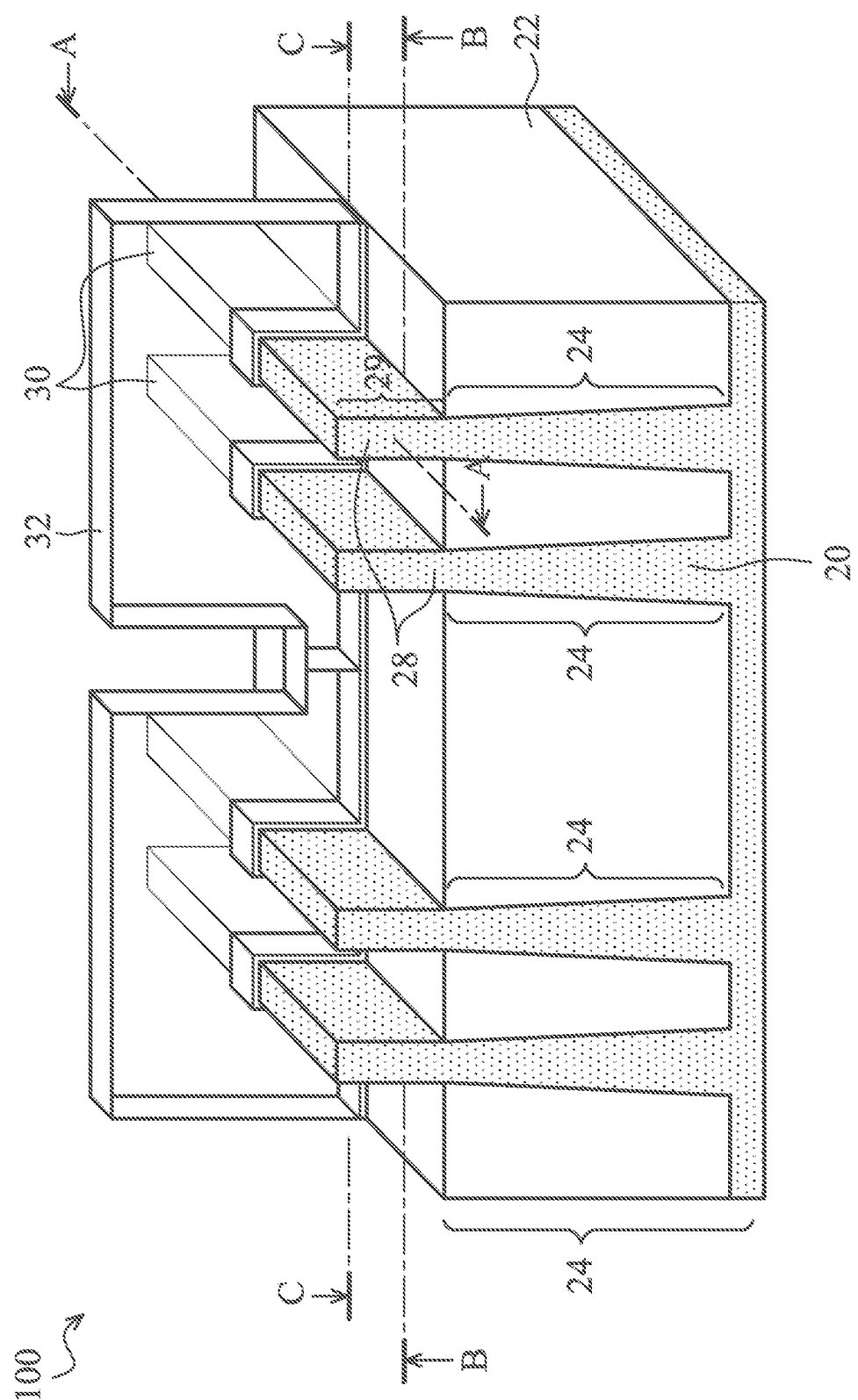
FIG. 1 illustrates a perspective view of a FinFET device according to an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a FinFET device with a fin-last approach. Other embodiments may also be applied, however, to planar devices as well as fin devices.

FIG. 1 illustrates a perspective view of a FinFET device 100. The FinFET device 100 includes a plurality of semiconductor strips 24 on a semiconductor substrate 20 with a dielectric layer 22 on semiconductor substrate 20 and surrounding the semiconductor strips 24. Each semiconductor strip 24 may have a fin 29 that is above a top surface of the dielectric layer 22. Each fin 29 may have a drain region 28, a source region 30, and a channel region (not shown) disposed between the drain region 28 and the source region 30. A gate 32 may be disposed over the channel regions (not shown) of the fins 29. Although FIG. 1 illustrates a FinFET device 100 with four fins 29 and a single gate 32, other embodiments with less or more than four fins 29 and more than a single gate 32 are within the scope of this disclosure.

FIGS. 2A through 5B illustrate in cross-sectional views various stages in the manufacture of a Fin-Last FinFET device 100 according to an embodiment, with the FIG. xA (e.g. 2A) being a cross-sectional view along the A-A line and the FIG. xB (e.g. 2B) being a cross-sectional view along the B-B line.

The semiconductor substrate 20 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Figure 2A:
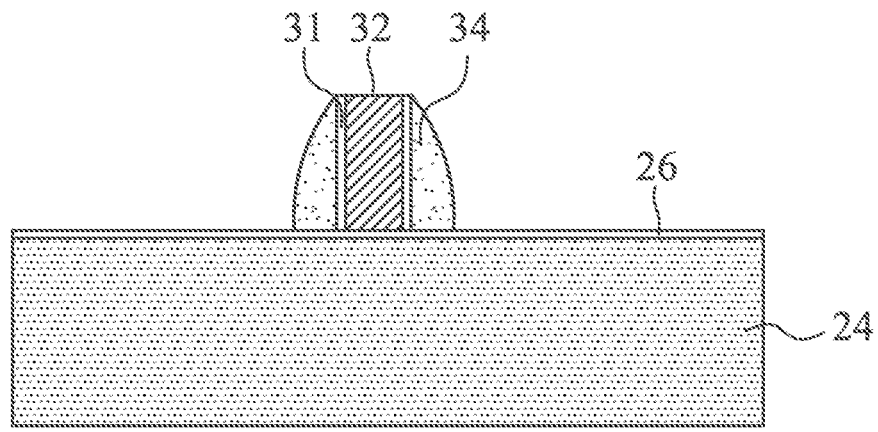
FIGS. 2A through 5B illustrate in cross-sectional views various stages in the manufacture of a Fin-Last FinFET device according to an embodiment.
Figure 2B:
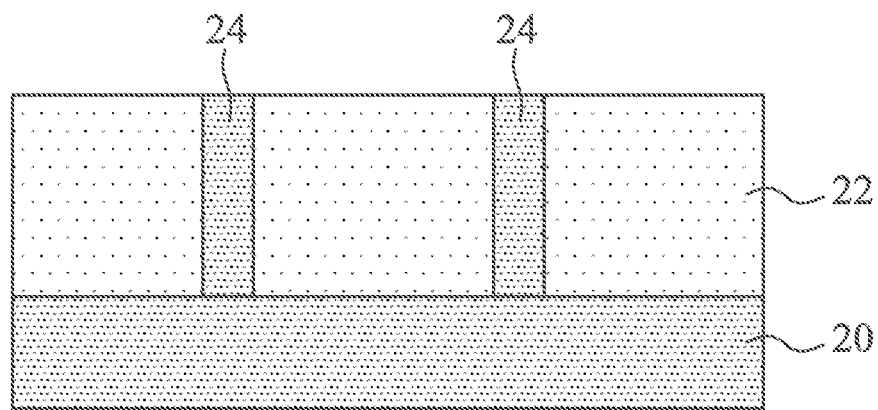

The semiconductor substrate 20 may include active devices (not shown in FIG. 2B). As one of ordinary skill in the art will recognize, a wide variety of devices such as transistors, capacitors, resistors, combinations of these, and the like may be used to generate the structural and functional requirements of the design for the FinFET device 100. The devices may be formed using any suitable methods. The fins 29 may be electrically coupled to the active and passive devices. Only a portion of the semiconductor substrate 20 is illustrated in the figures, as this is sufficient to fully describe the illustrative embodiments.

In an embodiment, the semiconductor strips 24 may be formed by patterning the semiconductor substrate 20. The patterning process may be accomplished by depositing mask material (not shown) such as photoresist or silicon oxide over the semiconductor substrate 20. The mask material is then patterned and the semiconductor substrate 20 is etched in accordance with the pattern. The resulting structure includes a plurality of semiconductor strips 24 formed on the semiconductor substrate 20. Each of the plurality of semiconductor strips 24 has a sidewall being substantially orthogonal to a top surface of the semiconductor substrate 20. In some embodiments, the semiconductor substrate 20 is etched to a specific depth, meaning the semiconductor strips 24 are formed to a height, the semiconductor strips 24 may have a height from about 10 nm to about 500 nm. The semiconductor strips 24 may have a width from about 5 nm to 50 nm. The semiconductor strips 24 may have a length from about 0.01 um to 10 um. In an alternative embodiment, the semiconductor strips 24 may be epitaxially grown from a top surface of the semiconductor substrate 20 within trenches or openings formed in a patterned layer (e.g. the dielectric layer 22) atop the semiconductor substrate 20. Because the process is known in the art, the details are not repeated herein.

The semiconductor strips 24 may be formed of semiconductor material such as silicon, germanium, silicon germanium, or the like. In an embodiment, the semiconductor strips 24 are silicon. The semiconductor strips 24 may then doped through an implantation process to introduce p-type or n-type impurities into the semiconductor strips 24.

The dielectric layer 22 may blanket deposited on the FinFET device 100. The dielectric layer 22 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The dielectric layer 22 may be deposited through a process such as chemical vapor deposition (CVD), or a spin-on-glass process, although any acceptable process may be utilized.

After the dielectric layer 22 is deposited, the dielectric layer 22 may be planarized to level a top surface of dielectric layer 22 and top surfaces of a hard mask layer (not shown in FIGS. 2A and 2B) on the tops of the semiconductor strips 24. The hard mask layer may be removed by an etch process comprising $H_3PO_4$ or the like. The dielectric layer 22 may be planarized in a variety of ways. In an embodiment, the planarization process involves a chemical mechanical polishing (CMP), in which the dielectric layer 22 is reacted and then ground away using an abrasive. This process may continue until the tops of the semiconductor strips 24 are exposed. In another embodiment, the dielectric layer 22 may be thinned by a diluted hydrofluoric acid (DHF) treatment or a vapor hydrofluoric acid (VHF) treatment for a suitable time.

After the dielectric layer 22 is planarized, a gate 32 may be formed over the semiconductor strips 24 and the dielectric layer 22. The gate 32 may include a gate dielectric layer 26 and gate spacers 34. The gate dielectric layer 26 may be formed by thermal oxidation, CVD, sputtering, or any other methods known and used in the art for forming a gate dielectric. In other embodiments, the gate dielectric layer 26 includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

The gate electrode layer (not shown) may be formed over the gate dielectric layer 26. The gate electrode layer may comprise a conductive material and may be selected from a group comprising polycrystalline-silicon (poly-Si), polycrystalline silicon-germanium (poly-SiGe), metallic nitrides, metallic silicides, metallic oxides, and metals. The gate electrode layer may be deposited by CVD, sputter deposition, or other techniques known and used in the art for depositing conductive materials. The top surface of the gate electrode layer usually has a non-planar top surface, and may be planarized prior to patterning of the gate electrode layer or gate etch. Ions may or may not be introduced into the gate electrode layer at this point. Ions may be introduced, for example, by ion implantation techniques. The gate electrode layer and the gate dielectric layer may be patterned to form the gate 32. The gate patterning process may be accomplished by depositing mask material (not shown) such as photoresist or silicon oxide over the gate electrode layer. The mask material is then patterned and the gate electrode layer is etched in accordance with the pattern.

Gate spacers 34 may be formed on opposite sides of the gate 32. The gate spacers 34 are typically formed by blanket depositing a spacer layer (not shown) on the previously formed structure. In an embodiment, the gate spacers 34 may include a spacer liner 31. The spacer liner 31 may comprise SiN, SiC, SiGe, oxynitride, oxide, combinations thereof, or the like. The spacer layer may comprise SiN, oxynitride, SiC, SiON, oxide, combinations thereof, or the like and may be formed by methods utilized to form such a layer, such as CVD, plasma enhanced CVD (PECVD), low pressure CVD (LPCVD), atomic layer deposition (ALD), sputter, and other methods known in the art. The gate spacers 34 are then patterned, preferably by anisotropically etching to remove the spacer layer from the horizontal surfaces of the structure.

Figure 3A:
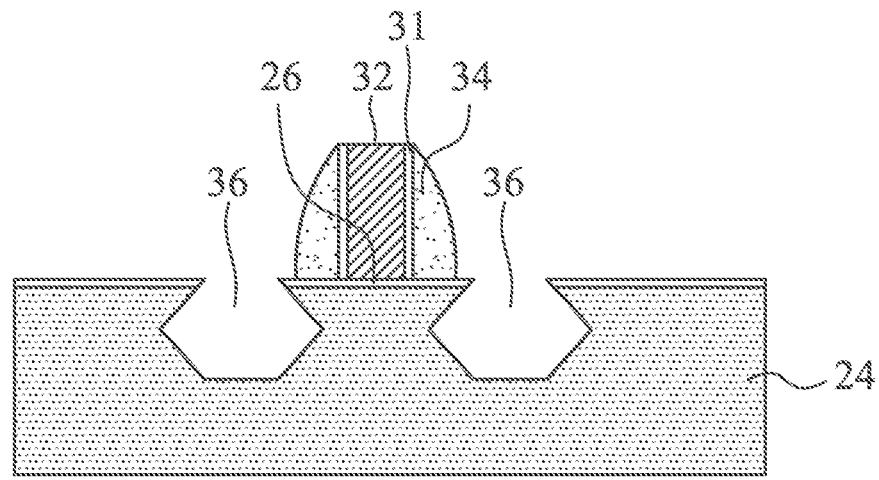
Figure 3B:
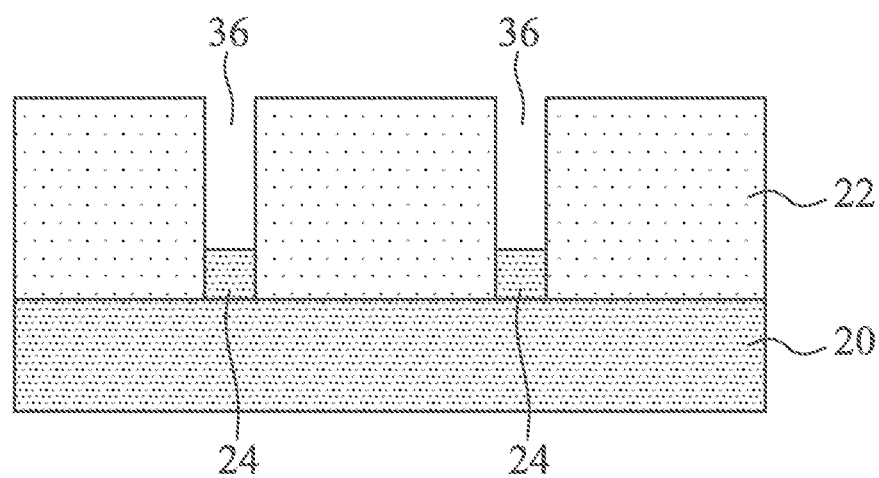

FIGS. 3A and 3B illustrate the etching of portions of the semiconductor strips 24 in a strained source drain (SSD) etch step to form recesses 36 in the semiconductor strips 24. The SSD etch may selectively etch the semiconductor strips 24 without etching the dielectric layer 22 or the gate 32 and gate spacers 34. In an embodiment, the recesses 36 may be etched to have a depth from about 5 nm to about 25 nm. The SSD etch step may performed in a variety of ways. In an embodiment, the SSD etch step may be performed by a dry chemical etch with a plasma source and an etchant gas. The plasma source may be an inductively coupled plasma (ICR) etch, a transformer coupled plasma (TCP) etch, an electron cyclotron resonance (ECR) etch, a reactive ion etch (RIE), or the like and the etchant gas may be fluorine, chlorine, bromine, combinations thereof, or the like. In another embodiment, the SSD etch step may be performed by a wet chemical etch, such as ammonium peroxide mixture (APM), $NH_4OH$, TMAH, combinations thereof, or the like. In yet another embodiment, the SSD etch step may be performed by a combination of a dry chemical etch and a wet chemical etch.

Figure 4A:
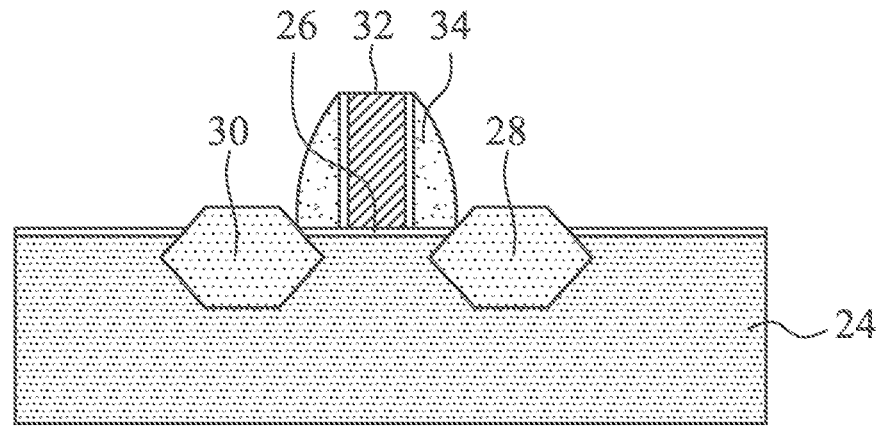
Figure 4B:
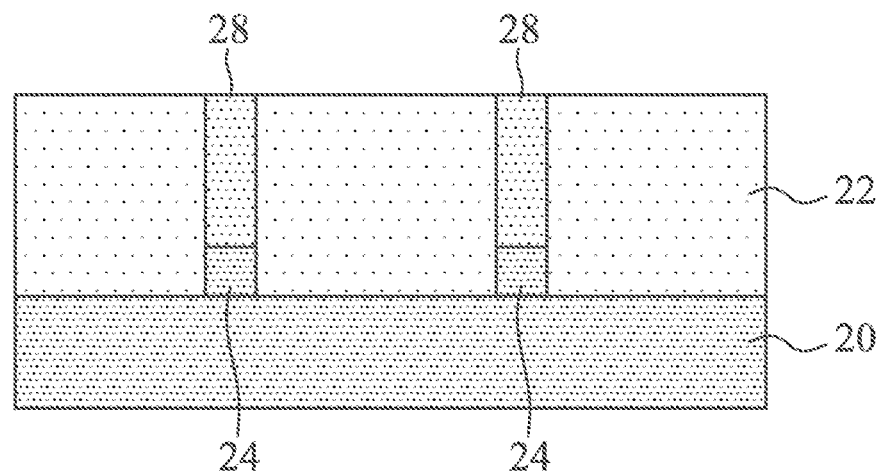

After the recesses 36 are formed, the source regions 30 and drain regions 28 may be formed in the recesses 36 as illustrated in FIGS. 4A and 4B. The source regions 30 and the drain regions 28 may be formed by epitaxially growing SiGe, Si, SiP, combinations thereof, or the like in the recesses 36 with an optional cap layer of Si over the source regions 30 and the drain regions 28. The epitaxial growth of the source regions 30 and the drain regions 28 forms a same crystalline orientation in the semiconductor strip 24, the source regions 30, and the drain regions 28. The growth of the source regions 30 and the drain regions 28 may be substantially confined by the dielectric layer 22. As illustrated in FIG. 4B, sidewalls of the drain regions 28 may be substantially orthogonal to the top surface of the semiconductor substrate 20 and a top surface of the drain regions 28 may substantially parallel with the top surface of the semiconductor substrate 20. In an embodiment, the top surface of the drain regions 28 may be substantially coplanar with a top surface of the dielectric layer 22. In another embodiment, the top surface of the drain regions 28 may be below or above the top surface of the dielectric layer 22. Although FIG. 4B only illustrates the drain regions 28, the source regions 30 have a similar structural configuration on an opposite side of gate 32 such that the description of the drain regions 28 is applicable to the source regions 30 as well.

In a PMOS embodiment, the source regions 30 and the drain regions 28 may comprise SiGex (where x≥0.1) and may be doped with boron. In an NMOS embodiment, the source regions 30 and the drain regions 28 may comprise Si or SiP and may be doped with phosphorous. In both the NMOS and PMOS embodiments, the source regions 30 and the drain regions 28 may include a Si cap layer over the source regions 30 and the drain regions 28.

Figure 5A:
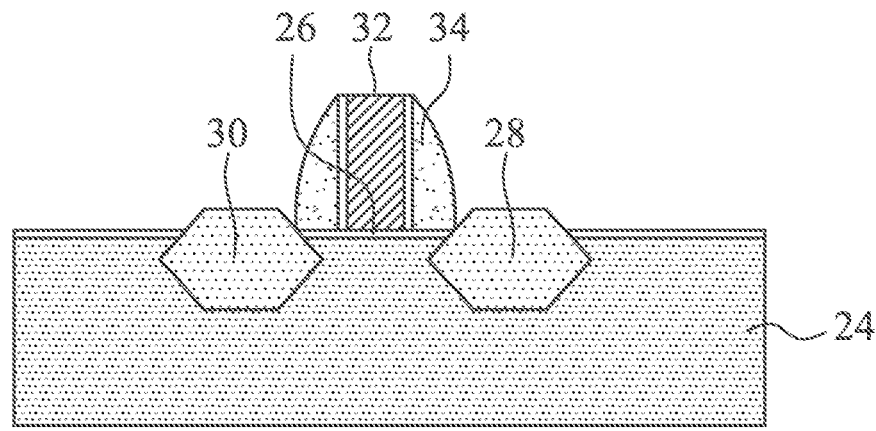
Figure 5B:
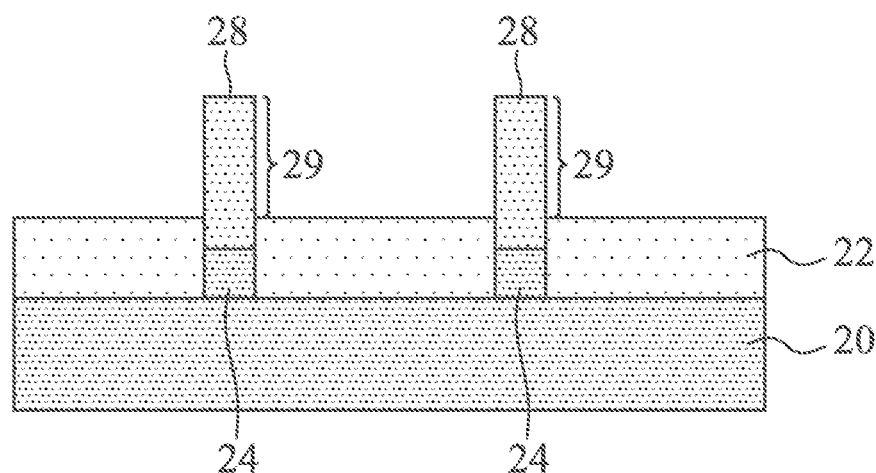

FIGS. 5A and 5B illustrate the formation of fins 29. The fins 29 may be formed by etching or recessing the dielectric layer 22 surrounding the semiconductor strips 24. The portion of the semiconductor strips 24 that extend above a top surface of the dielectric layer 22 forms the fins 29. In an embodiment, a top surface of the fin 29 may extend above the top surface of the dielectric layer 22 by about 10 nm to about 30 nm. The fins 29 may be formed by a chemical oxide reaction such as a CERTAS® etch, a Siconi etch (also referred to as SiCoNi), a DHF treatment, combinations thereof, or the like.

By forming the fins 29 after the source regions 30 and the drain regions 28 have been formed, the shape of source regions 30 and the drain regions 28 may be controlled and confined by the dielectric layer 22. This control and confinement will reduce or eliminate the faceting of the source regions 30 and the drain regions 28 which will reduce the resistance of the subsequent metal layers contacting the source regions 30 and the drain regions 28. Also, the facets on the source regions 30 and the drain regions 28 may allow the subsequent metal layers to leak through the intersection of the facets.

FIGS. 6A through 10C illustrate in cross-sectional views various stages in the manufacture of a Fin-Last, Gate-Last FinFET device 150 according to another embodiment, with the FIG. xA (e.g. 6A) being a cross-sectional view along the A-A line of FIG. 1, the FIG. xB (e.g. 6B) being a cross-sectional view along the B-B line of FIG. 1, and the FIG. xC (e.g. 6C) being a cross-sectional view along the C-C line of FIG. 1. Details regarding this embodiment that are similar to those for the previously described embodiment will not be repeated herein.

Figure 6A:
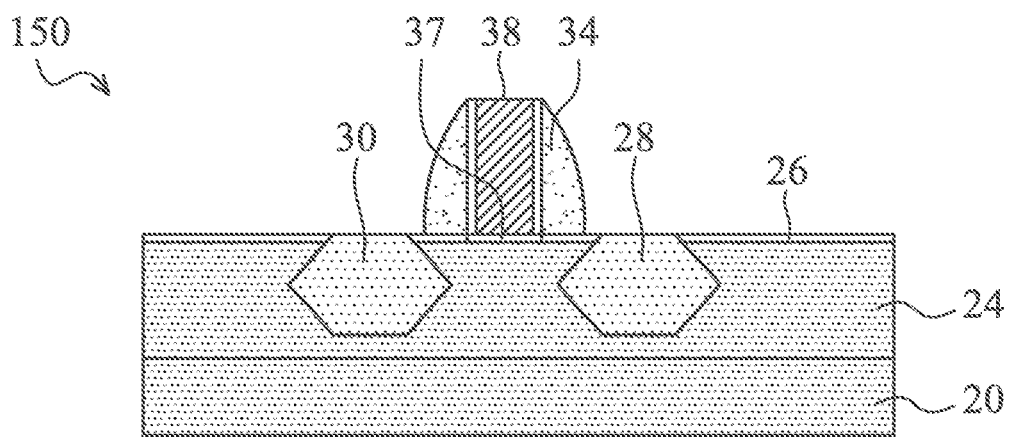
FIGS. 6A through 10C illustrate in cross-sectional views various stages in the manufacture of a Fin-Last, Gate-Last FinFET device according to another embodiment.
Figure 6B:
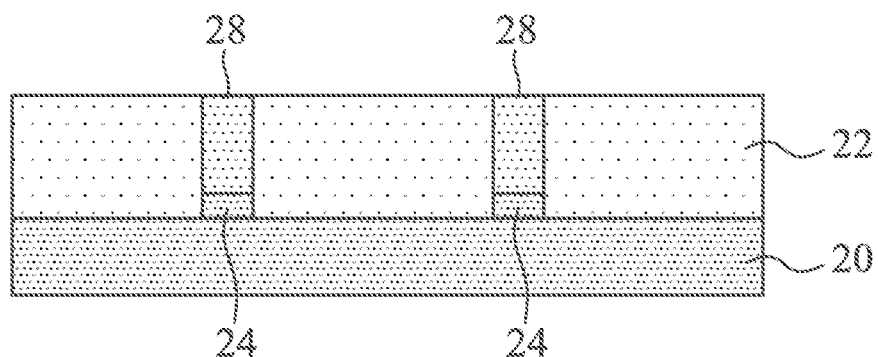
Figure 6C:
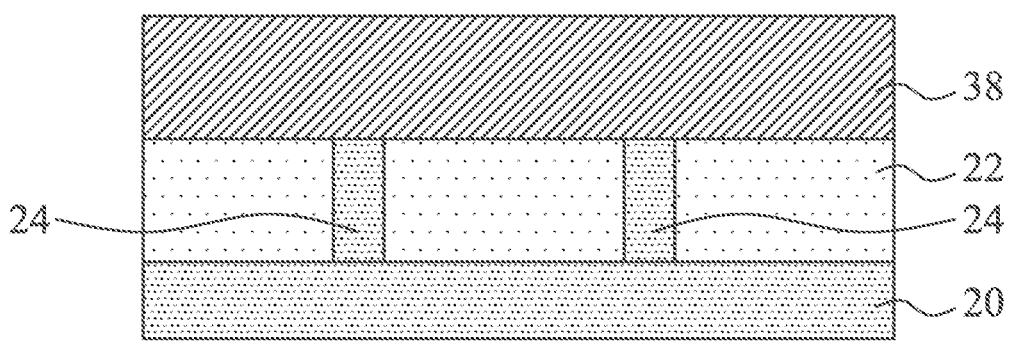

The FinFET device 150 in FIGS. 6A through 6C is at a similar stage of processing as the FinFET device 100 in FIGS. 4A and 4B except for the FinFET device 150 has a dummy gate 38 and a dummy gate dielectric layer 37 beneath the dummy gate 38. As such, the processing steps up to this stage are similar to those described in FIGS. 2A through 3B, and are not repeated herein. The dummy gate dielectric layer 26 may comprise similar materials as described in reference to FIGS. 2A and 2B, although any material suitable as a dummy gate dielectric may be used. In an embodiment, the dummy gate 38 may be formed from similar materials as gate 32 or dummy gate 38 may comprise a layer of TiN, TaN, combinations thereof, or the like on the dummy gate dielectric layer 37 followed by a layer of polysilicon.

Figure 7A:
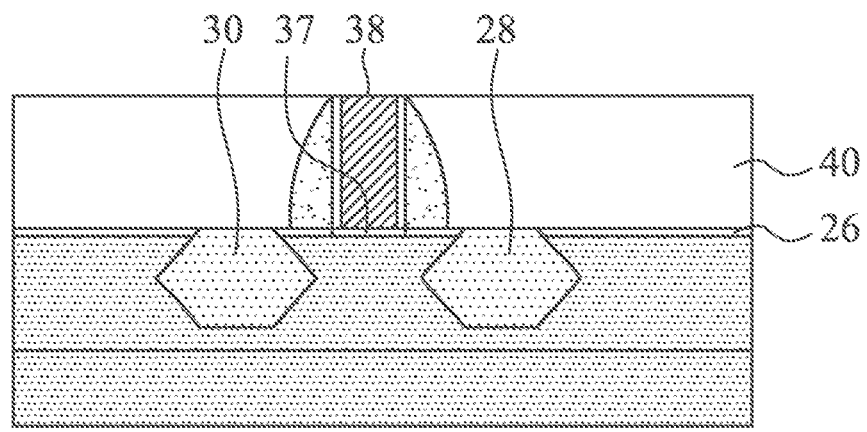
Figure 7B:
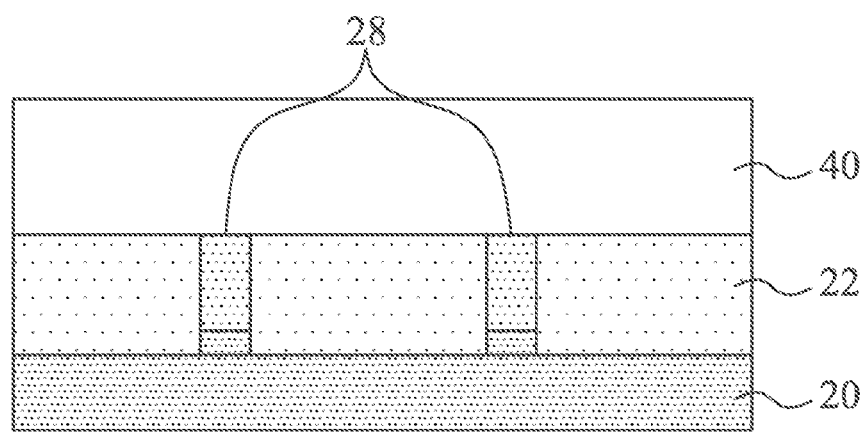
Figure 7C:
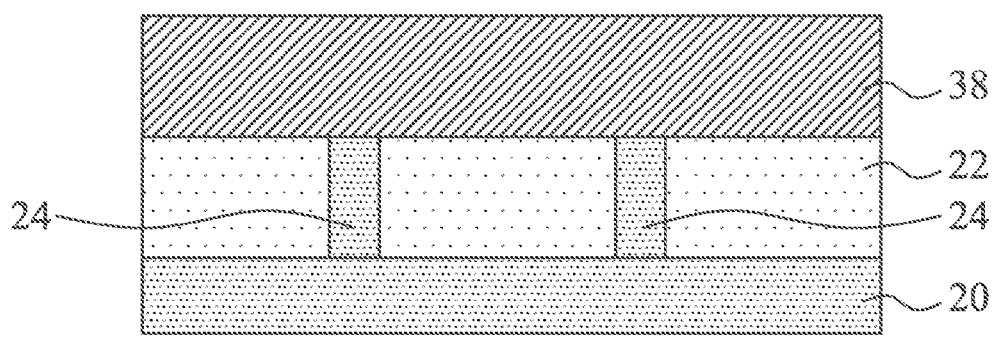

FIGS. 7A through 7C illustrate the formation of a etch stop layer (ESL) (not shown) and an inter-layer dielectric (ILD) 40 formed over the semiconductor substrate 20, the dummy gate 38, spacer liners 31, gate spacers 34, source region 30, and drain region 28. The ESL may be conformally deposited over components on the semiconductor substrate 20. In an embodiment, the ESL is silicon nitride, silicon oxide, the like, or a combination thereof and may be formed by PECVC, LPCVD, ALD, the like, or a combination thereof.

The ILD 40 may be formed over the ESL. In an embodiment, the ILD 40 may comprise silicon oxide, silicon nitride, the like, or a combination thereof. The ILD 40 may be formed by CVD, a high density plasma (HDP), the like, or a combination thereof. The ILD 40 may be planarized to a top surface of the dummy gate 38. In an embodiment, the ILD 40 is planarized by using a CMP to remove portions of the ILD 40. In other embodiments, other planarization techniques may be used, such as etching.

Figure 8A:
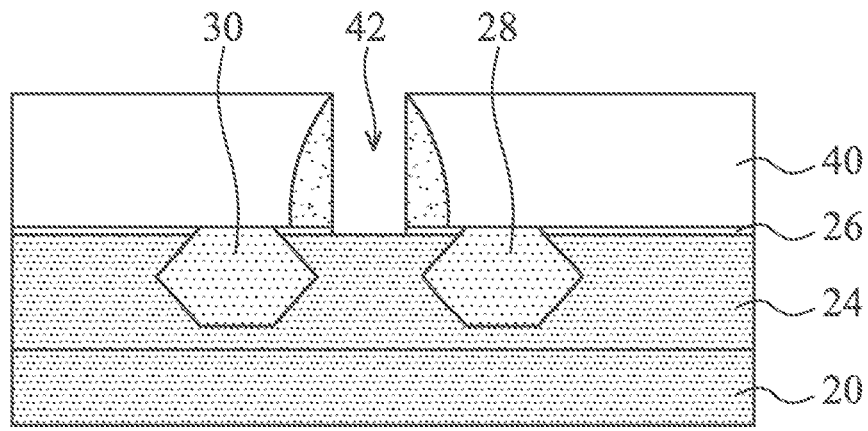
Figure 8B:
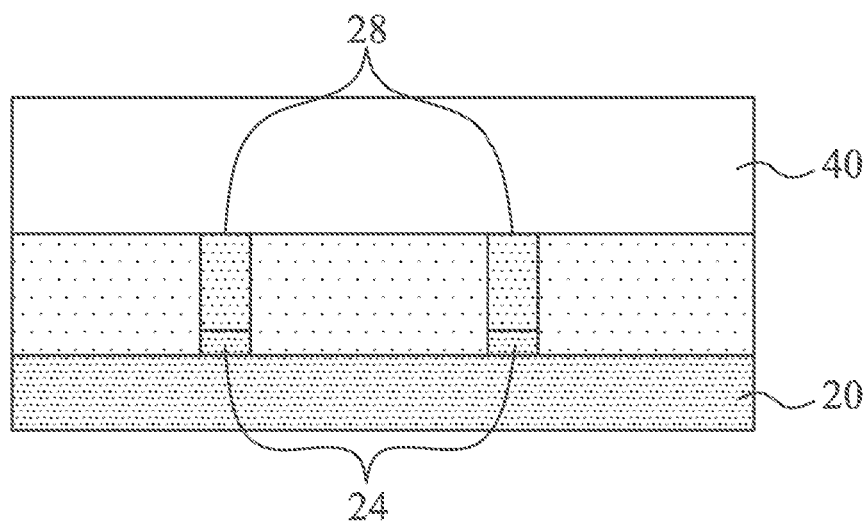
Figure 8C:
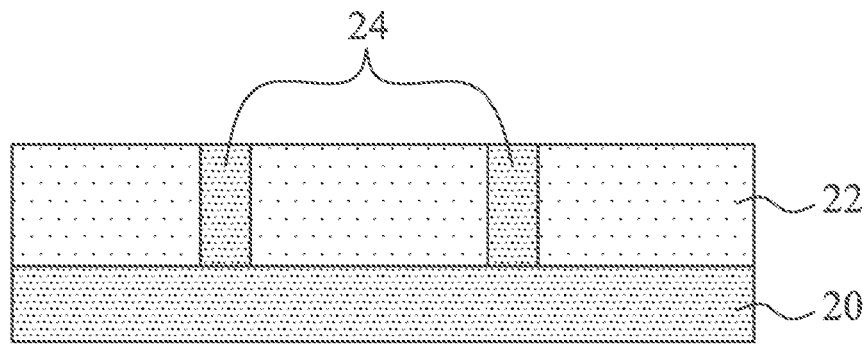

FIGS. 8A through 8C illustrate the removal of dummy gate 38 and the dummy gate dielectric layer 37 forming an opening 42 over the channel region in the semiconductor strip 24 between the source region 30 and the drain region 28. The dummy gate 38 may be removed by a dry etch that is selective to the material of the dummy gate 38. For example, if the dummy gate 38 comprises polysilicon, a dry etch using $NF_3$, $SF_6$, $Cl_2$, HBr, the like, or a combination thereof or a wet etch using NH4OH, tetramethylammonium hydroxide (TMAH), the like, or a combination thereof may be used to remove the dummy gate 38.

Figure 9A:
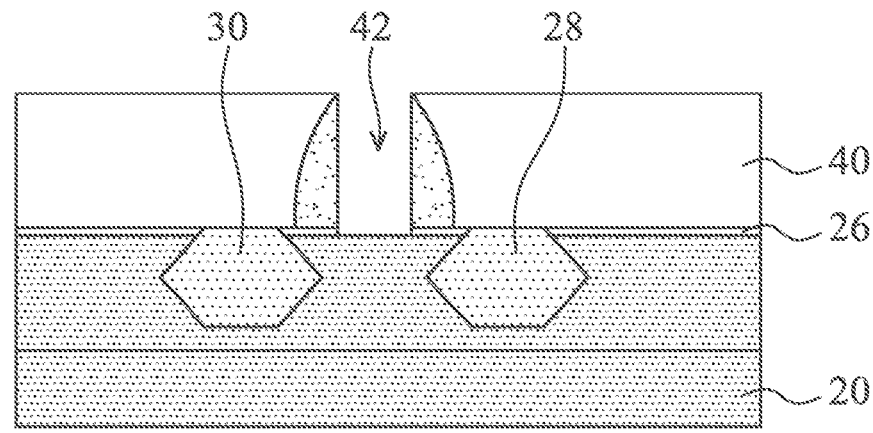
Figure 9B:
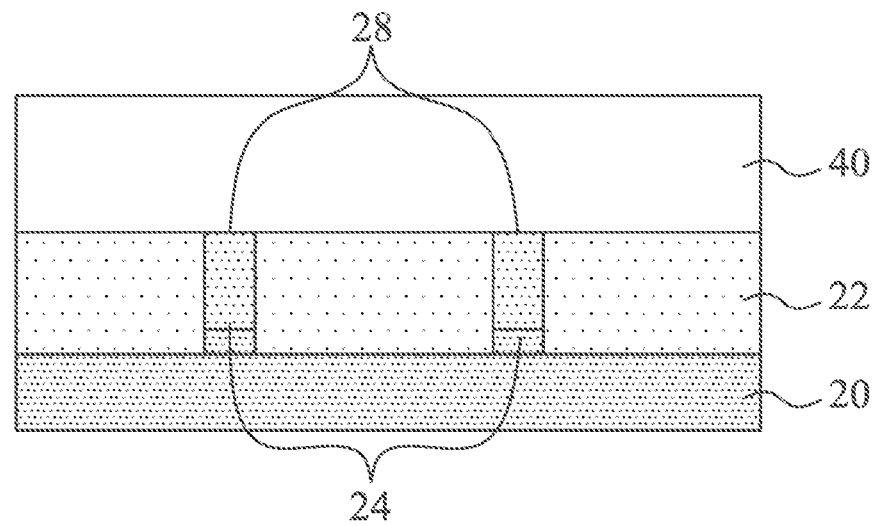
Figure 9C:
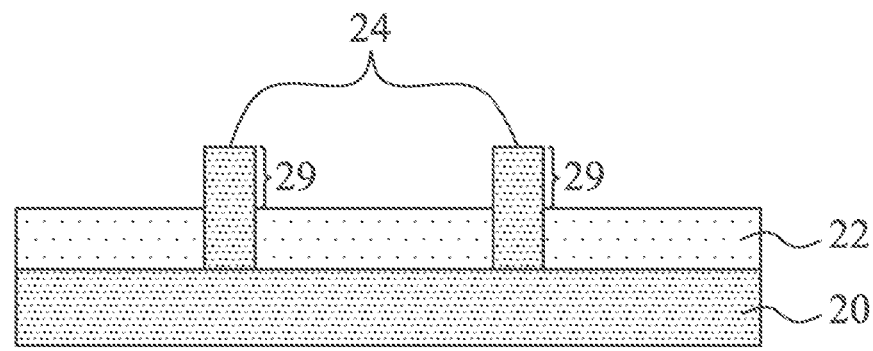

After the dummy gate 38 is removed, the fins 29 may be formed by an etch process to recess the dielectric layer 22 in the area under the removed dummy gate 38 (see FIG. 9C). This fin formation step may be performed by similar processes as described in the fin formation of FIGS. 5A and 5B, and is not repeated herein. In an embodiment, the dielectric layer 22 may be recessed beneath the opening 42 (see FIG. 9C), but not in the areas surrounding the source region 30 and the drain region 28 (see FIG. 9B).

Figure 10A:
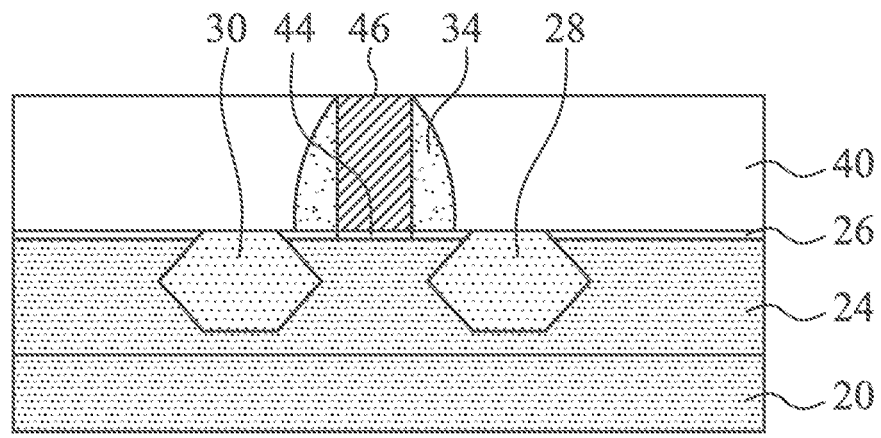
Figure 10B:
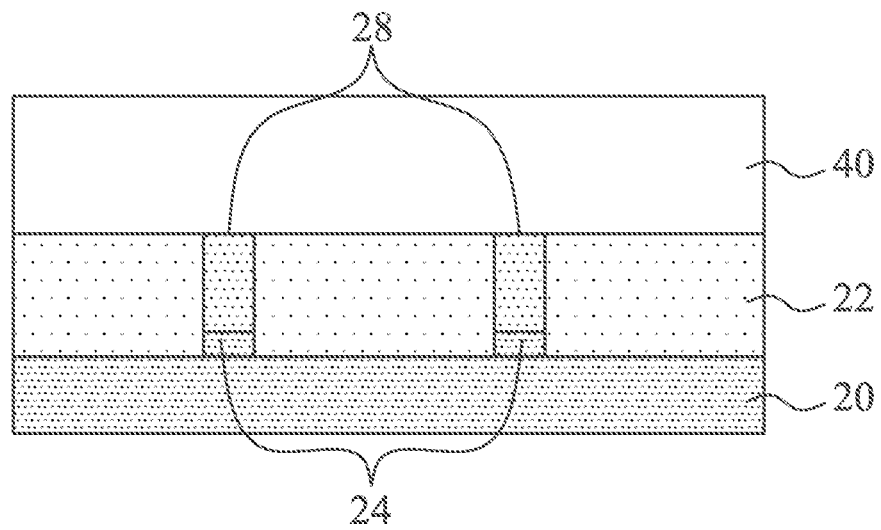
Figure 10C:
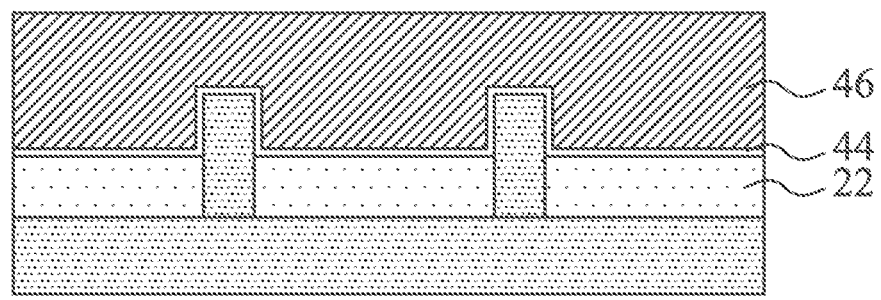

FIGS. 10A through 10C illustrate the formation of gate dielectric layer 44 and gate 46 in the opening 42. The gate dielectric layer 44 and gate 46 may be formed of similar materials and by similar processes as gate dielectric layer 26 and gate 32 described in FIGS. 2A and 2B, and are not repeated herein. As shown in FIG. 10C, the gate 46 and the gate dielectric layer 44 adjoins three sides of the fin 29.

FIGS. 11A through 16CC illustrate in cross-sectional views various stages in the manufacture of a Fin-Last, Gate-Last, Replacement Channel FinFET device 200 according to another embodiment, with the FIG. xA (e.g. 6A) being a cross-sectional view along the A-A line of FIG. 1, the FIG. xB (e.g. 6B) being a cross-sectional view along the B-B line of FIG. 1, and the FIG. xC (e.g. 6C) being a cross-sectional view along the C-C line of FIG. 1. Details regarding this embodiment that are similar to those for the previously described embodiments will not be repeated herein.

Figure 11A:
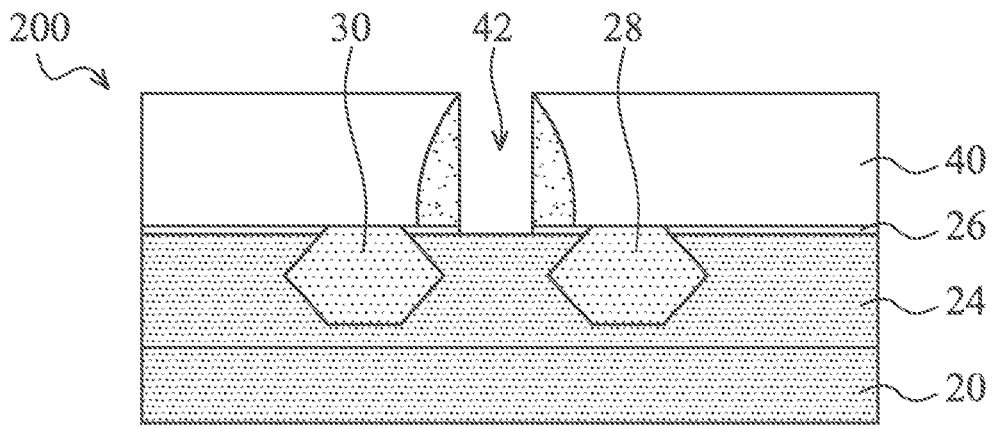
FIGS. 11A through 16C illustrate in cross-sectional views various stages in the manufacture of a Fin-Last, Gate-Last, Replacement Channel FinFET device according to another embodiment.
Figure 11B:
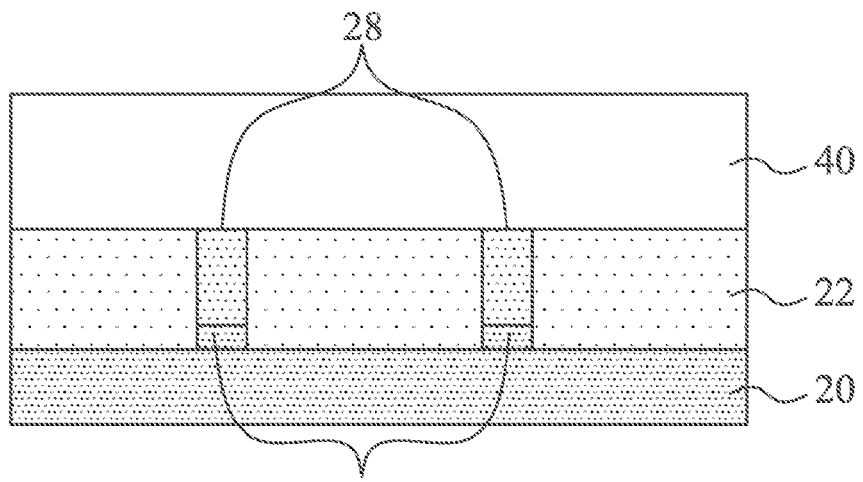
Figure 11C:
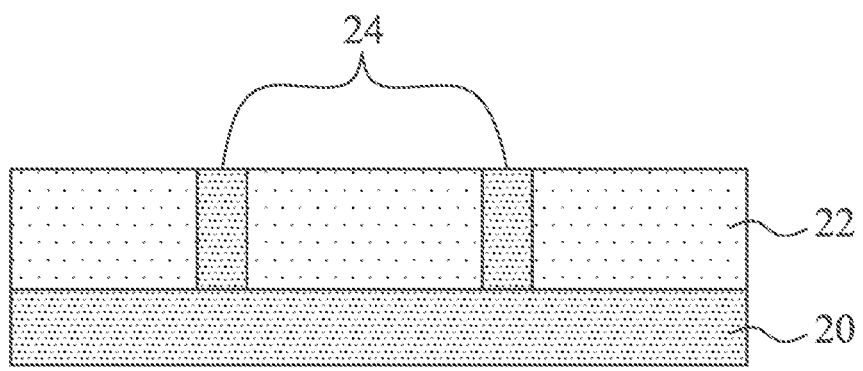

The FinFET device 200 in FIGS. 11A through 11C is at a similar stage of processing as the FinFET device 150 in FIGS. 9A through 9C with the dummy gate and dummy gate dielectric removed to form opening 42. As such, the processing steps up to this stage are similar to those described in FIGS. 2A through 3B and 6A through 9C are not repeated herein.

Figure 12A:
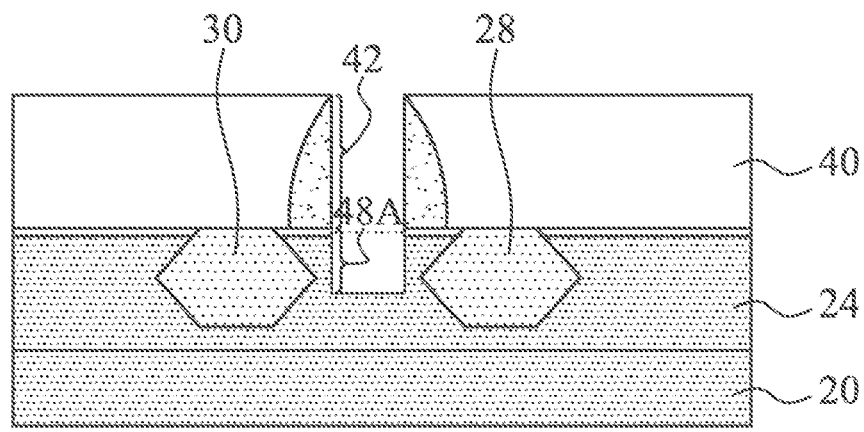
Figure 12B:
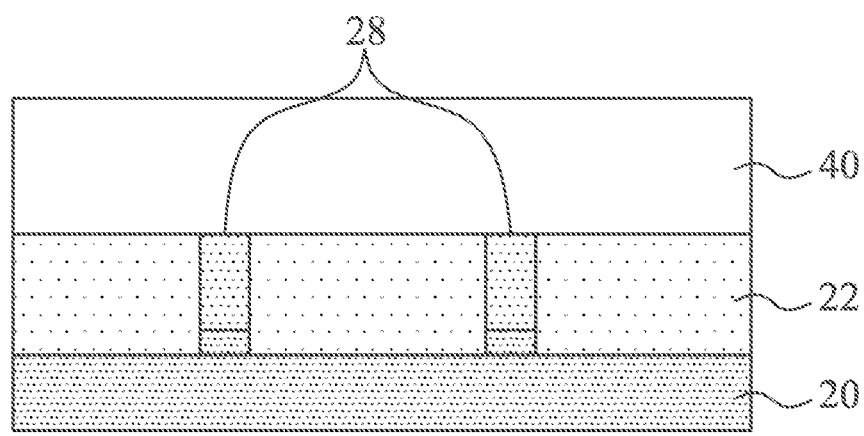
Figure 12C:
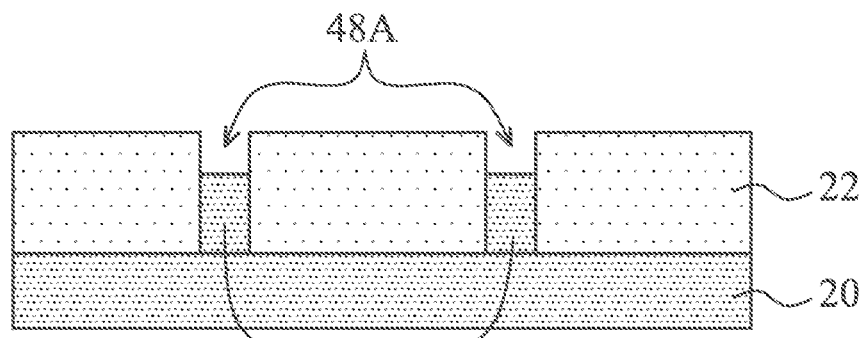

FIGS. 12A through 12C illustrate the removal of the channel region by forming an opening 48A in the semiconductor strips 24. The opening 48A may be formed to a depth of about 5 nm to about 45 nm from a top surface of the semiconductor strip 24. The opening 48A may be formed by an etch process. In an embodiment, the etch may be performed by a dry chemical etch with a plasma source and an etchant gas. The plasma source may be an ICR, a TCP, an ECR, a RIE, or the like and the etchant gas may be fluorine, chlorine, bromine, combinations thereof, or the like.

Figure 13A:
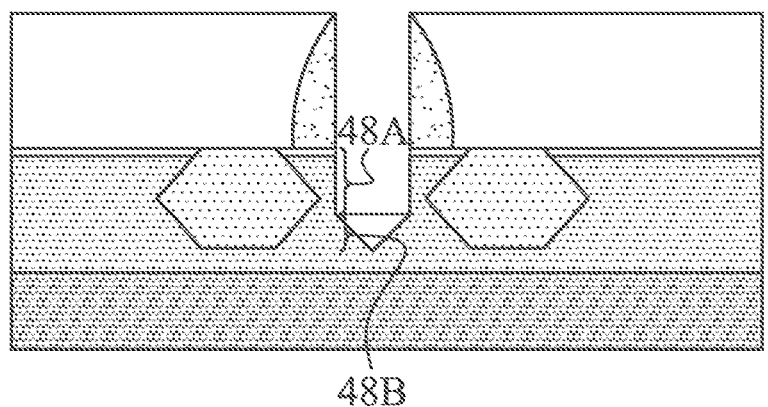
Figure 13B:
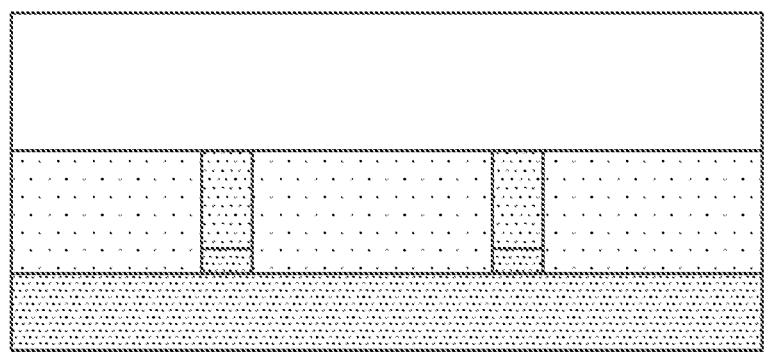
Figure 13C:
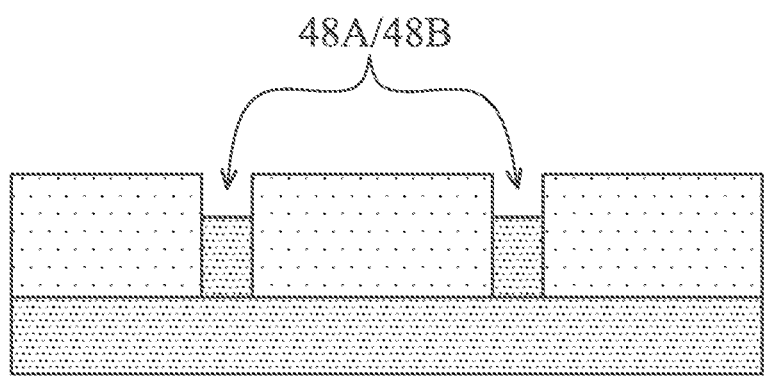

FIGS. 13A through 13C illustrate an embodiment wherein another etch is performed to form opening 48B to have a V-shape below the opening 48A. A V-shape opening may be accomplished by the embodiment that comprises a wet chemical etch such as $NH_4OH$, TMAH, the like, or a combination thereof. The step of forming opening 48B is optional as the final shape of the replacement channel opening could be non-V shape (opening 48A only) or V-shape (opening 48A in addition to 48B).

Figure 14A:
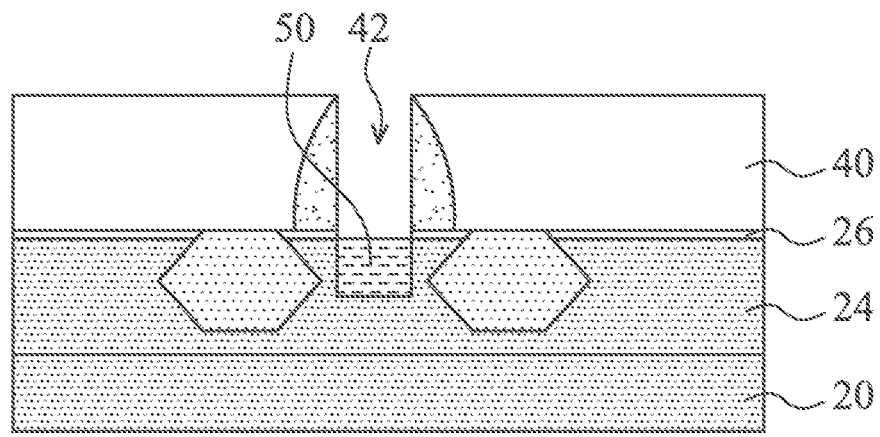
Figure 14B:
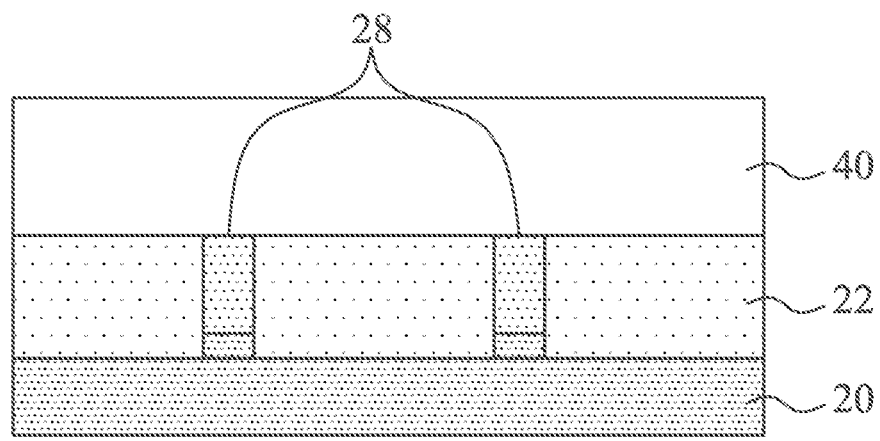
Figure 14C:
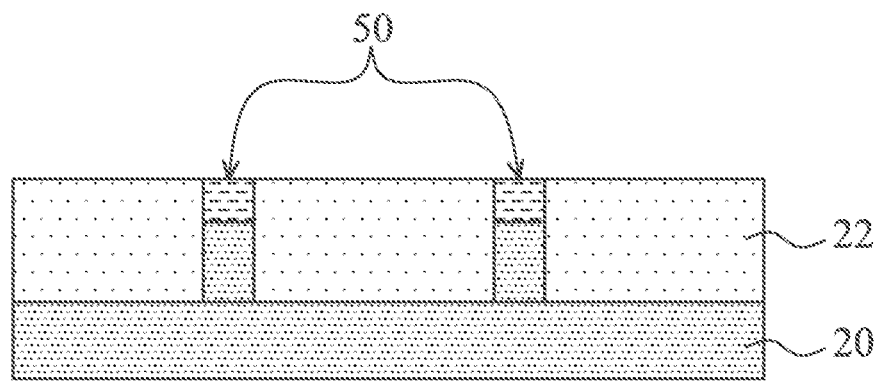

After the opening 48A and the optional opening 48B are formed, the replacement channel 50 may be formed in the opening 48A as illustrated in FIGS. 14A through 14C. The replacement channel region 50 may induce a strain and/or allow higher mobility in the channel region so that the Fin- FET device 200 may have better device performance. The replacement channel region 50 may be formed by epitaxially growing SiGe, Si, SiP, Ge, the like, or a combination thereof in the 48A with an optional cap layer of Si over the replacement channel region 50. The growth of the replacement channel region 50 may be substantially confined by the dielectric layer 22 and the semiconductor strip 24. As illustrated in FIGS. 14A and 14C, sidewalls of the replacement channel region 50 may be substantially orthogonal to the top surface of the semiconductor substrate 20 and a top surface of the replacement channel region 50 may substantially parallel with the top surface of the semiconductor substrate 20. In an embodiment, the top surface of the replacement channel region 50 may be substantially coplanar with a top surface of the dielectric layer 22 and the top surface of the semiconductor strip 24. In another embodiment, the top surface of the replacement channel region 50 may be below or above the top surface of the dielectric layer 22 and the semiconductor strip 24.

In a PMOS embodiment, the replacement channel region 50 may comprise SiGex (where x≥0.1) and may be doped with boron. In an NMOS embodiment, the replacement channel region 50 may comprise Si and may be doped with phosphorous. In both the NMOS and PMOS embodiments, the replacement channel 50 may include a Si cap layer over the replacement channel region 50.

Figure 15A:
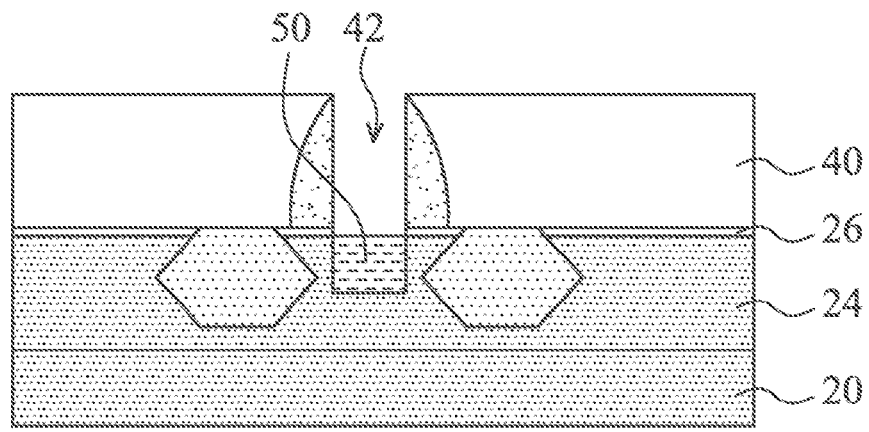
Figure 15B:
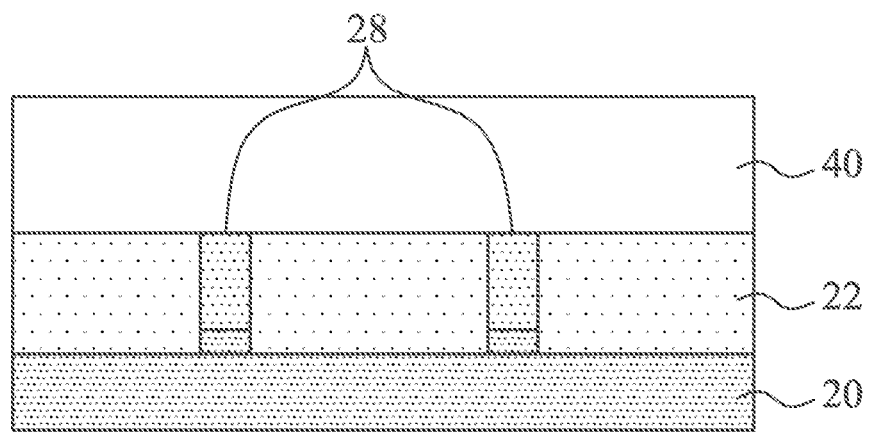
Figure 15C:
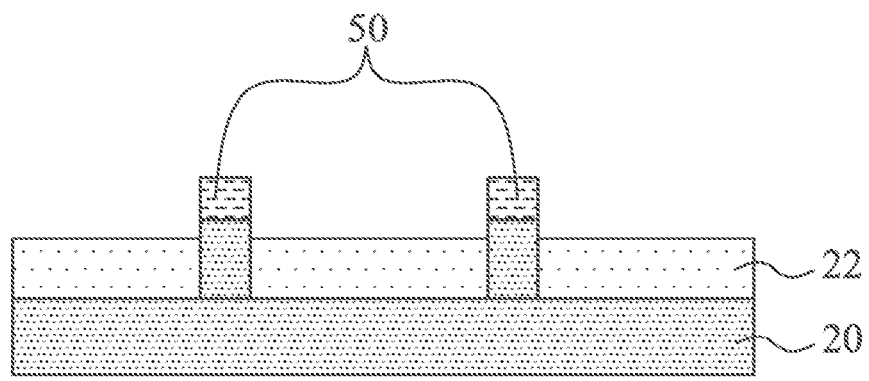

After the replacement channel region 50 is formed, the fins 29 may be formed by an etch process to recess the dielectric layer 22 in the area under the opening 42 as illustrated in FIGS. 15A through 15C. This fin formation step may be performed by similar processes as described in the fin formation of FIGS. 5A and 5B, and is not repeated herein. In an embodiment, the dielectric layer 22 may be recessed beneath the opening 42 (see FIG. 15C), but not in the areas surrounding the source region 30 and the drain region 28 (see FIG. 15B).

Figure 16A:
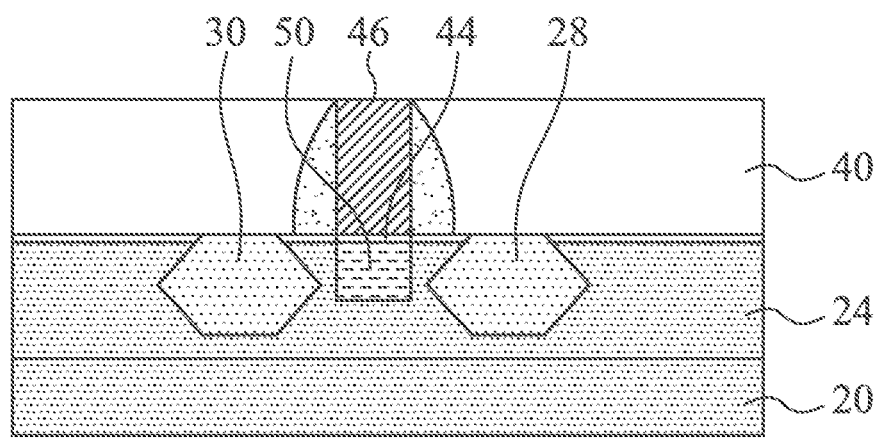
Figure 16B:
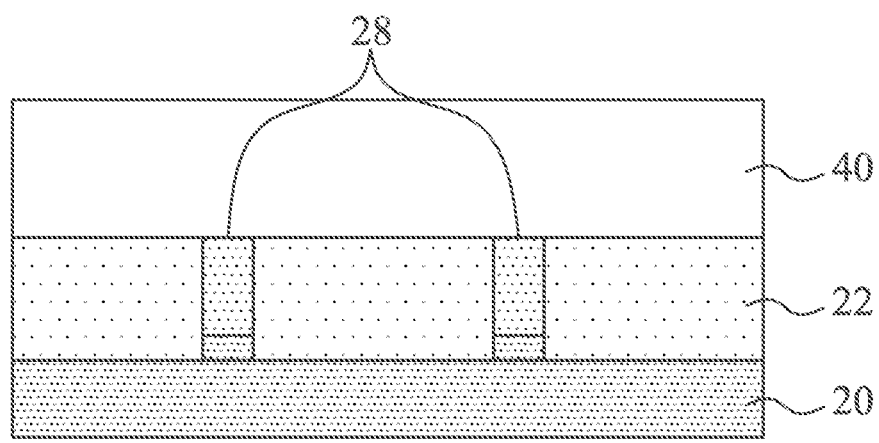
Figure 16C:
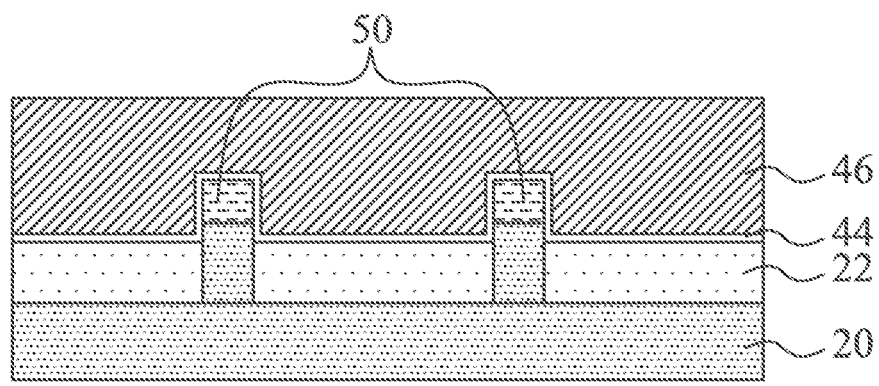

FIGS. 16A through 16C illustrate the formation of gate dielectric layer 44 and gate 46 in the opening 42 and over the replacement channel region 50. The gate dielectric layer 44 and gate 46 may be formed of similar materials and by similar processes as gate dielectric layer 26 and gate 32 described in FIGS. 2A and 2B, and are not repeated herein. As shown in FIG. 16C, the gate 46 and the gate dielectric layer 44 adjoins three sides of the fin 29.

By forming the fins 29 after the source regions 30 and the drain regions 28 have been formed, the shape of source regions 30 and the drain regions 28 may be controlled and confined by the dielectric layer 22. This control and confinement will reduce or eliminate the faceting of the source regions 30 and the drain regions 28 which will reduce the resistance of the subsequent metal layers contacting the source regions 30 and the drain regions 28. Also, the facets on the source regions 30 and the drain regions 28 may allow the subsequent metal layers to leak through the intersection of the facets. Further, by replacing the channel region with a replacement channel region 50, the FinFET device 200 may have better performance due to the strain inducing and/or high mobility channel region.

FIGS. 17 through 31 illustrate in cross-sectional views along a semiconductor strip 24 (A-A line of FIG. 1) of various stages in the manufacture of a PMOS FinFET 400 and an NMOS FinFET 300, both in a Fin-Last, Gate-Last, Replacement Channel configuration according to another embodiment. Details regarding this embodiment that are similar to those for the previously described embodiments will not be repeated herein.

Figure 17:
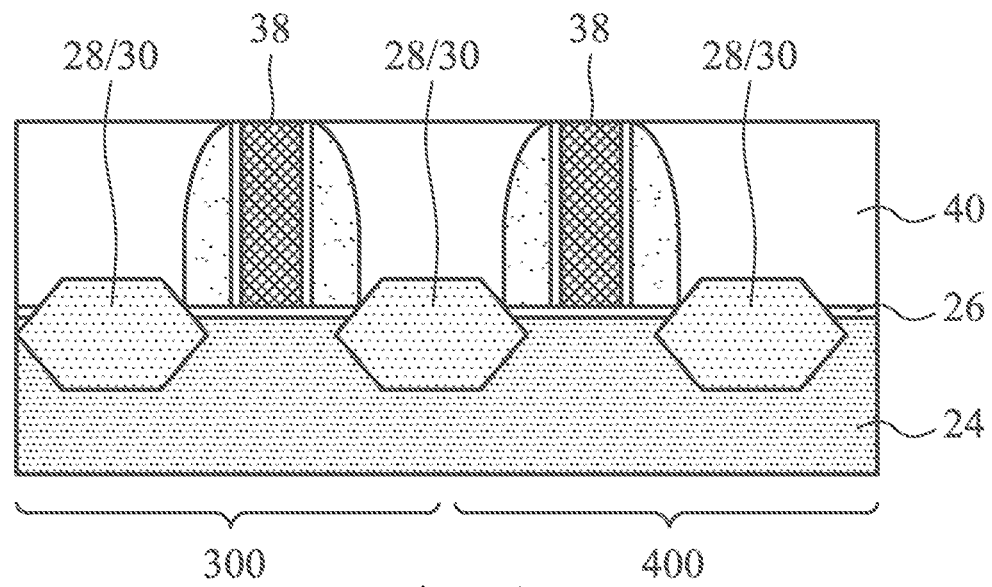
FIGS. 17 through 31 illustrate in cross-sectional views various stages in the manufacture of a PMOS and an NMOS Fin-Last, Gate-Last, Replacement Channel FinFET device according to another embodiment.

FIG. 17 illustrates an NMOS FinFET 300 and a PMOS FinFET 400 with each of the NMOS and PMOS FinFETs 300 and 400 comprising a source region 30 and a drain region 28. The source regions 30 and the drain region 28 are formed in a semiconductor strip 24 with and ILD 40 formed over the semiconductor strip 24 and the dummy gates 38.

Figure 18:
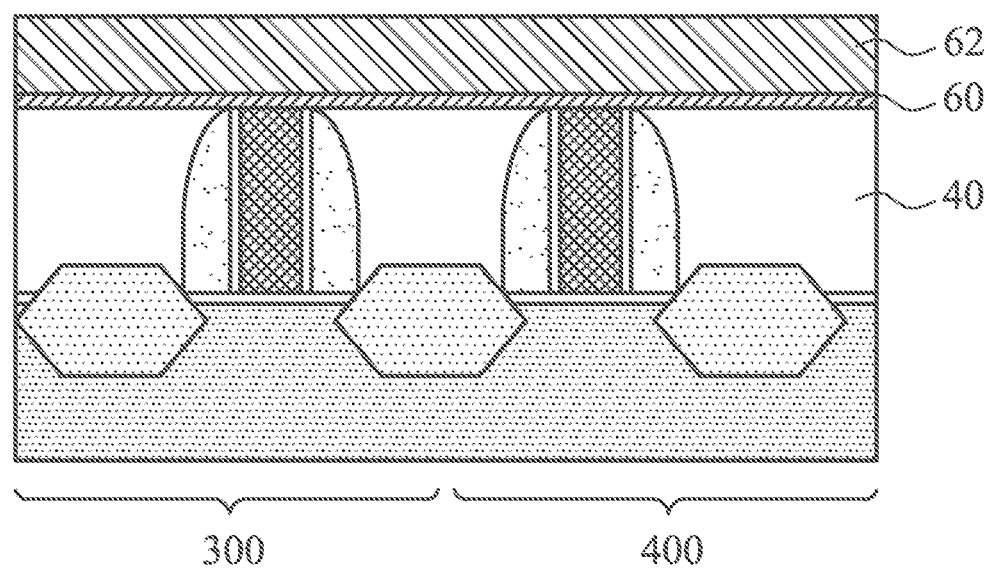

FIG. 18 illustrates an ESL 60 formed over the ILD 40 and the dummy gates 38 and a hard mask layer 62 formed over the ESL 60. The ESL 60 may be formed of an oxide, a nitride, the like, or a combination thereof and the hard mask layer 62 may be formed of SiN, SiON, SiO$_2$ the like, or a combination thereof.

Figure 19:
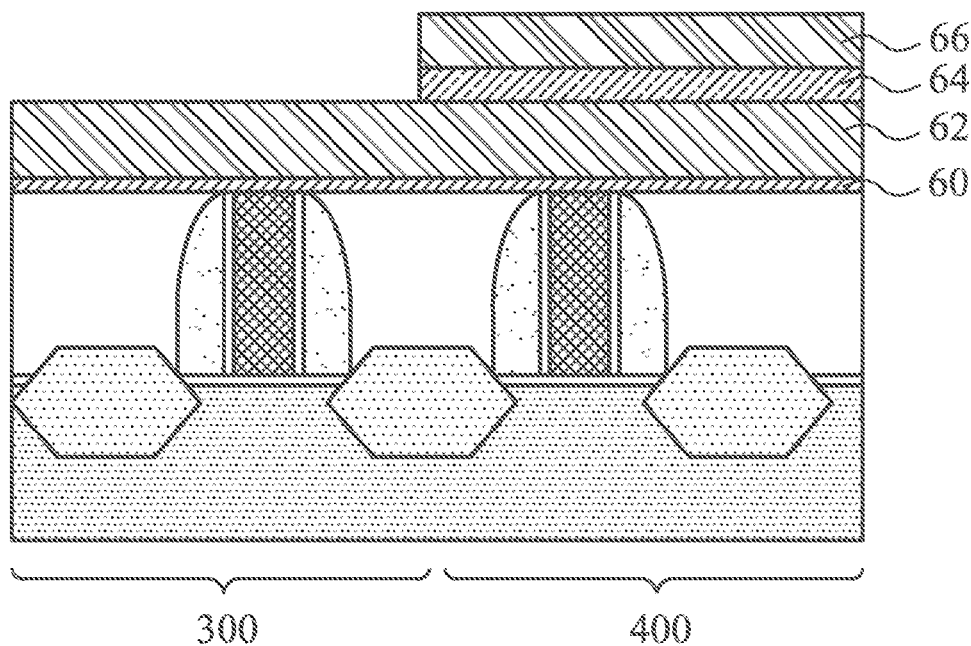
Figure 20:
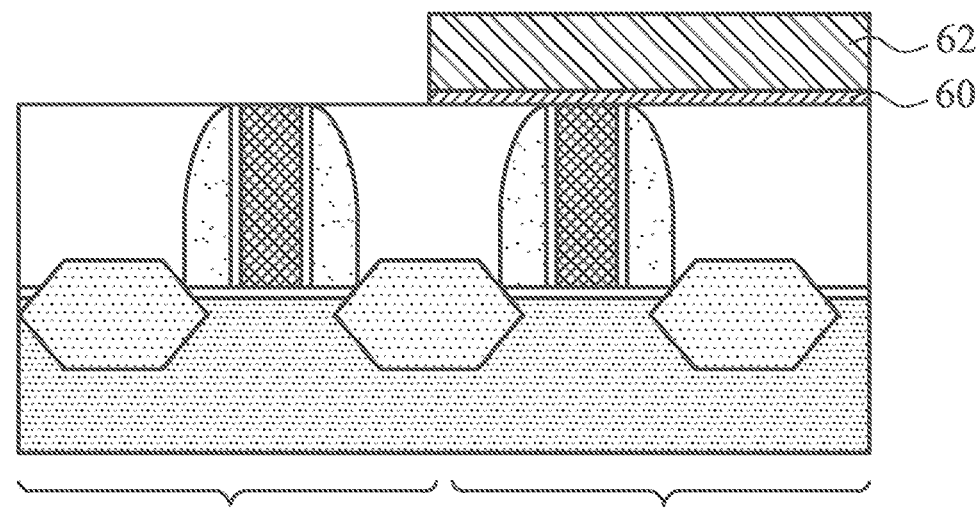

In FIG. 19, a bottom anti-reflective coating (BARC) layer 64 is formed over the hard mask layer 62. The BARC layer 64 prevents radiation in a subsequent photolithographic process to reflect off layers below and interfering with the exposure process. Such interference can increase the critical dimension of the photolithography process. The BARC layer 64 may be formed by CVD, the like, or a combination thereof. A photoresist 66 may be deposited and patterned over the BARC layer 64. After developing and removing a portion of the photoresist 66, an etch step is further performed into the BARC layer 64 to expose the portion of the hard mask layer 62 over the NMOS FinFET 300. FIG. 20 illustrates the transferring of the photoresist 66 pattern to the hard mask layer 62 to expose the NMOS FinFET 300.

Figure 21:
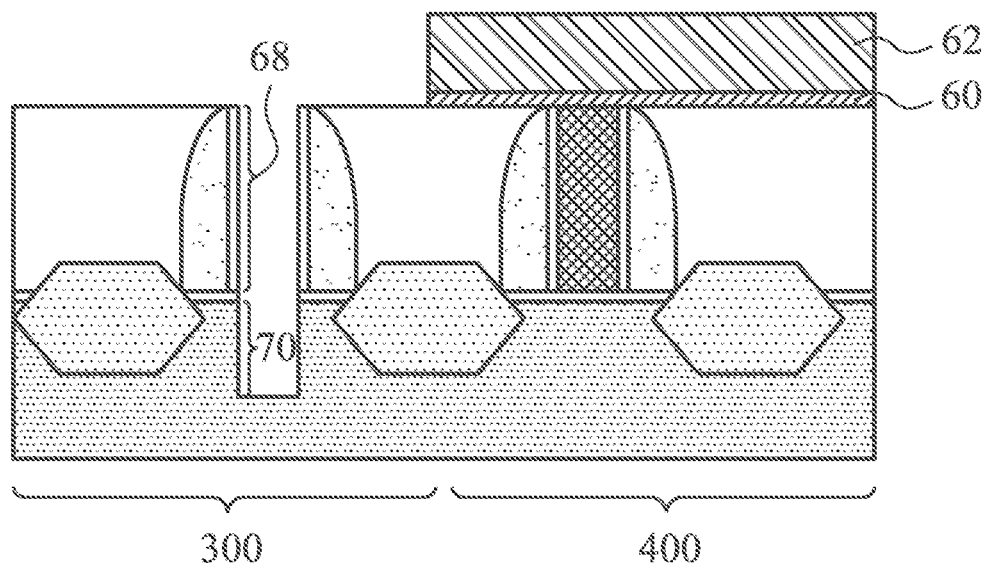
Figure 22:
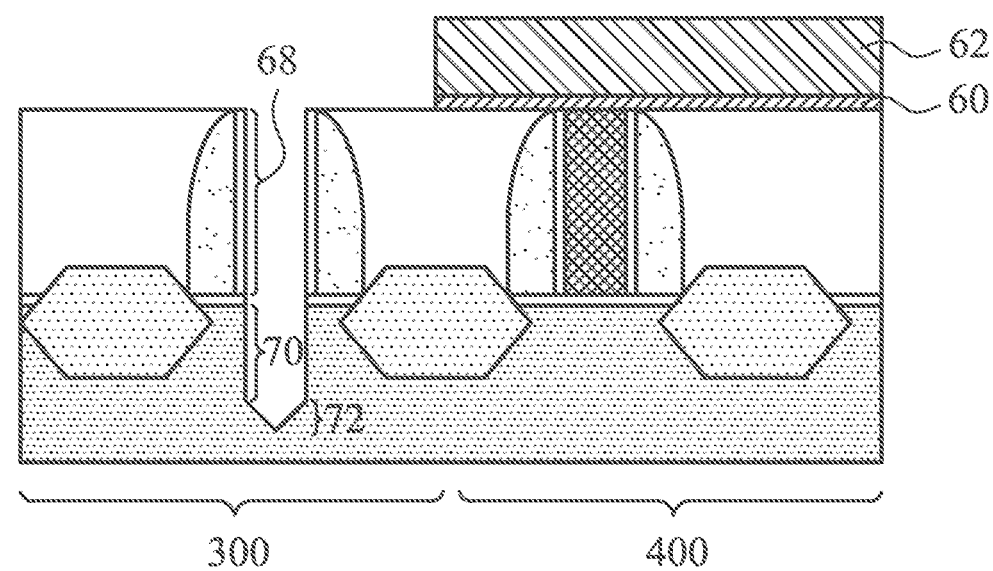

In FIG. 21, the dummy gate 38 of the NMOS FinFET 300 is removed and a channel region below the dummy gate 38 is removed. A first etch may be performed to form opening 68 and a second etch may be performed to form opening 70 in the semiconductor strip 24. This step may be performed in a similar manner as described above in reference to FIGS. 12A through 12C and will not be repeated herein. FIG. 22 illustrates the formation of a V-shape opening 72 below the opening 70. This step may be performed in a similar manner as described above in reference to FIGS. 13A through 13C and will not be repeated herein.

Figure 23:
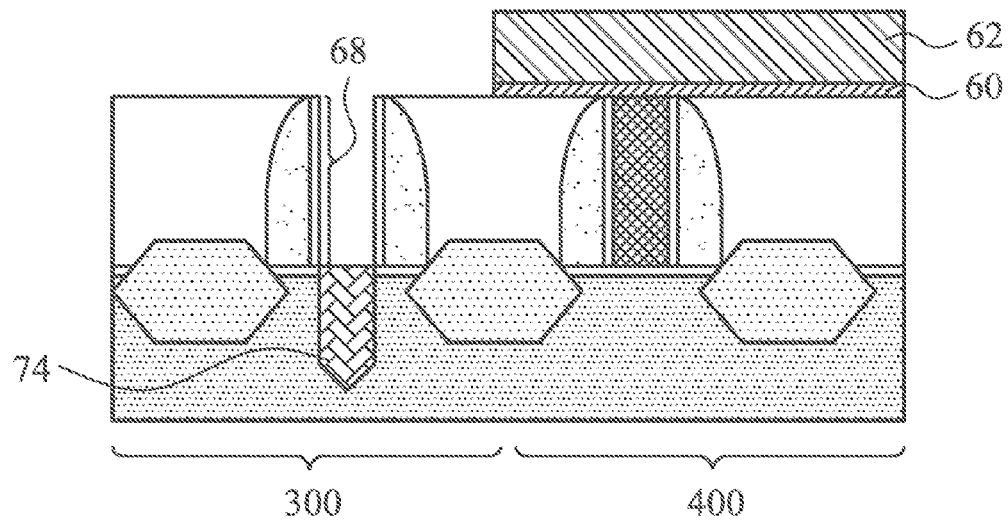
Figure 24:
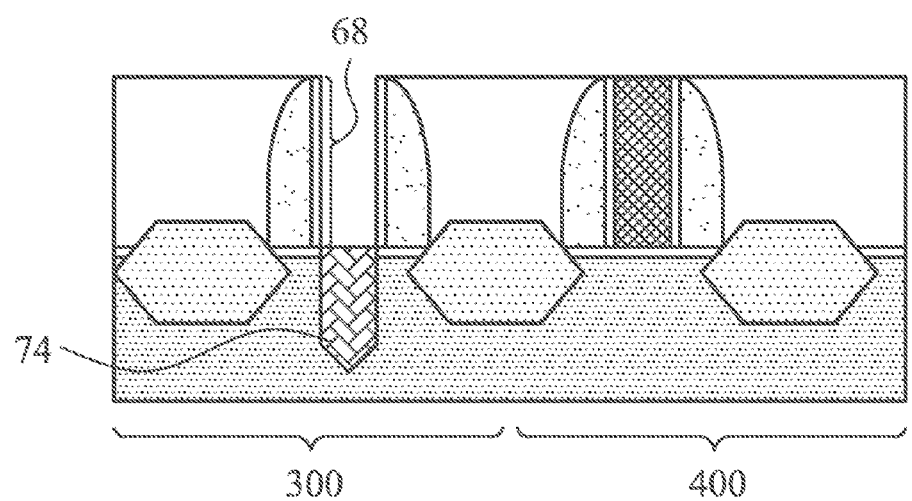

FIG. 23 illustrates the formation of a V-shaped NMOS replacement channel region 74 in the openings 70 and 72. This step may be performed in a similar manner as described above in reference to FIGS. 14A through 14C and will not be repeated herein. FIG. 24 illustrates the removal of the hard mask layer 62 and the ESL 60 over the PMOS FinFET device 400. This step may be performed by an etch comprising H$_3$PO$_4$, a DHF treatment, the like, or a combination thereof.

Figure 25:
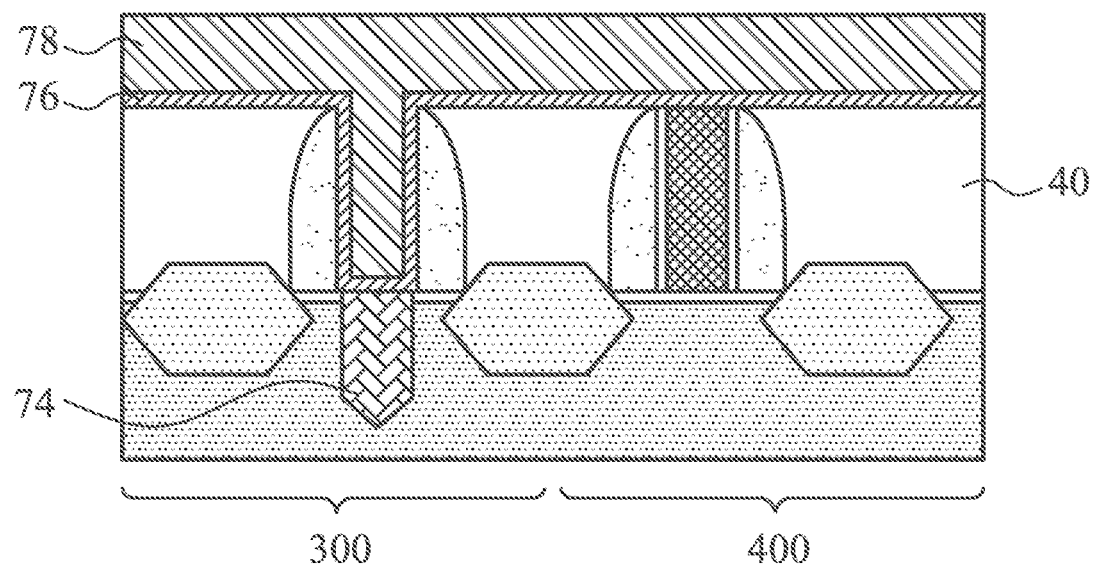
Figure 26:
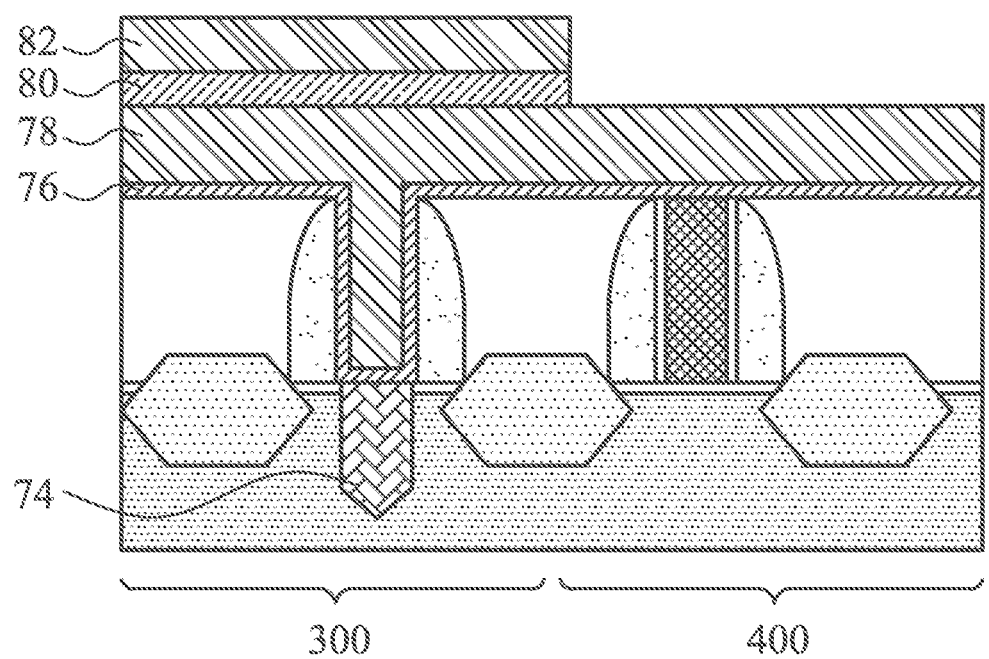
Figure 27:
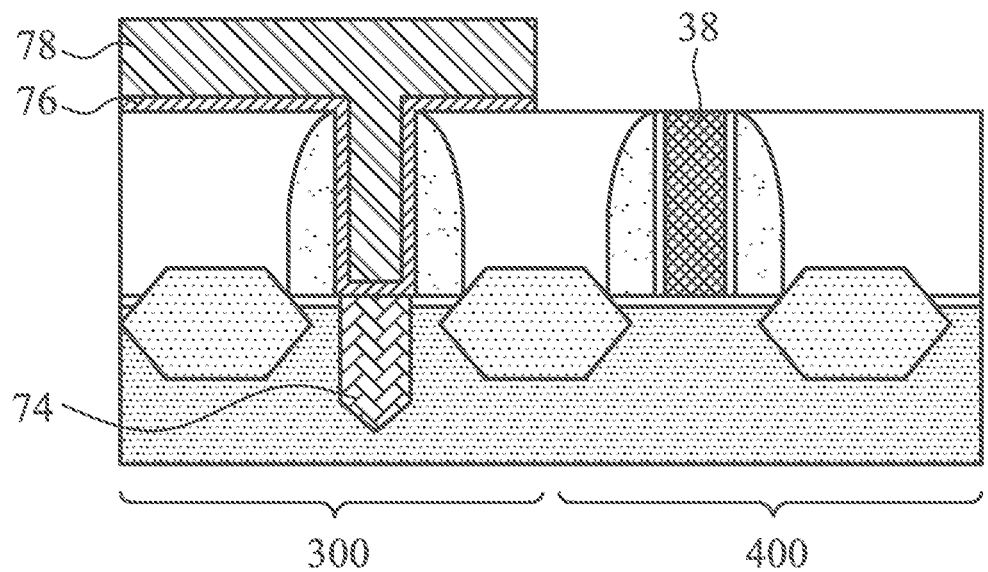

FIG. 25 illustrates the formation of another ESL 76 and a hard mask layer 78 over the ILD 40 and the NMOS and PMOS FinFETs 300 and 400. The ESL 76 and the hard mask layer 78 may be deposited in the opening 68, wherein the ESL 76 adjoins the gate spacers 34 and at top surface of the V-shaped NMOS replacement channel region 74. This step may be performed in a similar manner as described above in reference to FIG. 18 and will not be repeated herein. FIG. 26 illustrates the formation of another BARC layer 80 and a photoresist 82 that is patterned to expose the hard mask layer 78 over the PMOS FinFET 400. This step may be performed in a similar manner as described above in reference to FIG. 19 and will not be repeated herein. FIG. 27 illustrates the patterning of the hard mask layer 78 and the ESL 76 to expose the dummy gate 38 over the PMOS FinFET 400. This step may be performed in a similar manner as described above in reference to FIG. 20 and will not be repeated herein.

Figure 28:
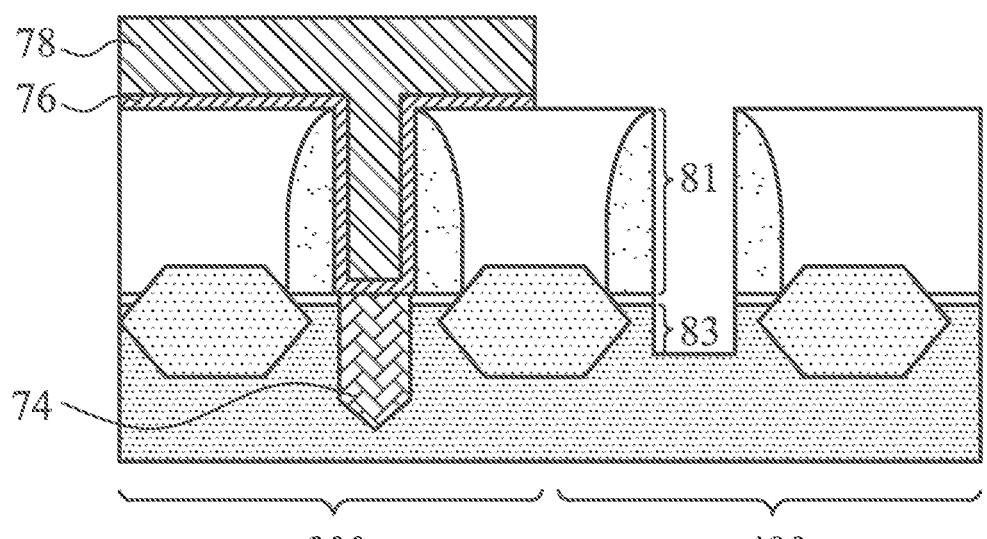
Figure 29:
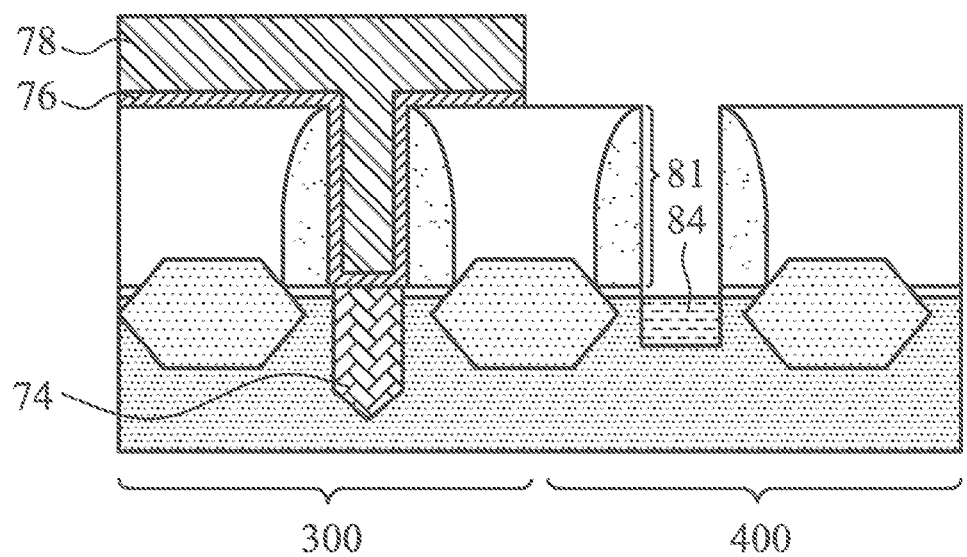

FIG. 28 illustrates the removal of the dummy gate 38 over the PMOS FinFET 400 and a channel region below the dummy gate 38 is removed. This step may be performed in a similar manner as described above in reference to FIG. 21 and will not be repeated herein. FIG. 29 illustrates the formation of PMOS replacement channel region 84 in the opening 83. This step may be performed in a similar manner as described above in reference to FIGS. 14A through 14C and will not be repeated herein. In an embodiment, the PMOS replacement channel region 84 may have a shallower depth than the NMOS replacement channel region 74 (see FIG. 29). In another embodiment, the PMOS replacement channel region 84 may have a different shape than the NMOS replacement channel region 74 (see FIG. 29). As described above in reference to FIGS. 14A through 14C, the NMOS replacement channel region 74 may comprise different materials than the PMOS replacement channel region 84, although the materials may be the same. In another embodiment, the processing flow may form the NMOS FinFET 300 first or the PMOS FinFET 400 first.

Figure 30:
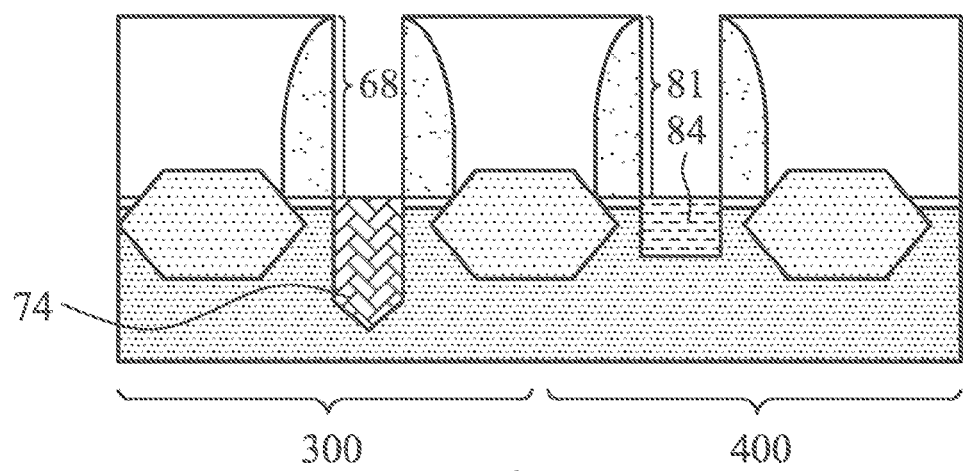
Figure 31:
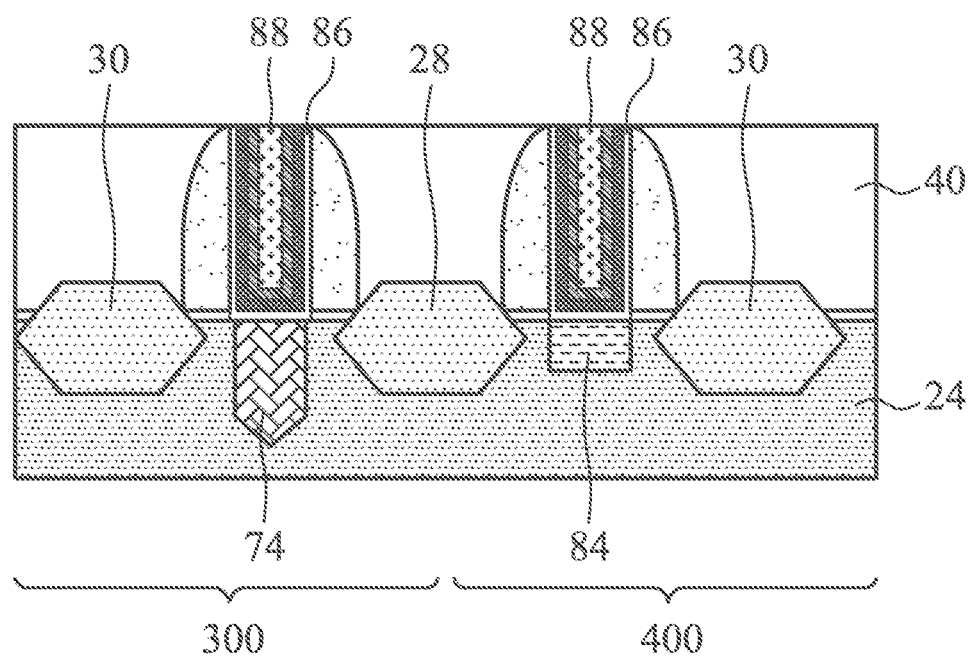

FIG. 30 illustrates the removal of the hard mask layer 78 and the ESL 76. This step may be performed in a similar manner as described above in reference to FIG. 24 and will not be repeated herein. After the removal of the hard mask layer 78 and the ESL 76, the fins may be formed by recessing the dielectric layer (not shown) surround the semiconductor strips 24. This step may be performed in a similar manner as described above in reference to FIGS. 15A through 15C and will not be repeated herein. FIG. 31 illustrates the formation of the gate dielectric layer 86 and the gates 88 over the NMOS replacement channel region 74 and the PMOS replacement channel region 84. This step may be performed in a similar manner as described above in reference to FIGS. 16A through 16C and will not be repeated herein.

An embodiment is a method for forming a FinFET device, the method comprising forming a semiconductor strip over a semiconductor substrate, wherein the semiconductor strip is disposed in a dielectric layer, forming a gate over the semiconductor strip and the dielectric layer, and forming a first recess and a second recess in the semiconductor strip, wherein the first recess is on an opposite side of the gate from the second recess. The method further comprises forming a source region in the first recess and a drain region in the second recess, and recessing the dielectric layer, wherein a first portion of the semiconductor strip extends above a top surface of the dielectric layer forming a semiconductor fin.

Another embodiment is a method of forming a FinFET device, the method comprising forming a semiconductor strip over a semiconductor substrate, wherein the semiconductor strip is disposed in a dielectric layer, forming a first dummy gate over the semiconductor strip and the dielectric layer, forming a first set of gate spacers on opposite sides of the first dummy gate, etching recesses in the semiconductor strip, and epitaxially growing a first source region in one of the recesses and a first drain region in another one of the recesses. The method further comprises removing the first dummy gate to expose a first channel region in the semiconductor strip, removing the first channel region in the semiconductor strip, forming a first replacement channel region in the semiconductor strip, etching the dielectric layer, wherein the first replacement channel region extends above a top surface of the dielectric layer, and wherein a portion of the semiconductor strip extends above the top surface of the dielectric layer forming a semiconductor fin, and forming a first active gate over the first replacement channel region.

Yet another embodiment is a FinFET device comprising a dielectric layer on a semiconductor substrate, a semiconductor fin extending from the semiconductor substrate, wherein the semiconductor fin is disposed in the dielectric layer, and a first source region and a first drain region disposed in the semiconductor fin, wherein the first source region and the first drain region comprise a first epitaxial material, wherein the first source region and the first drain region have sidewalls that are substantially orthogonal to a top surface of the semiconductor substrate. The FinFET device further comprises a first channel region in the semiconductor fin, wherein the first channel region is laterally between the first source region and the first drain region, and a first gate structure over the semiconductor fin, wherein the first gate structure is over the first channel region.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A FinFET device comprising:
   a dielectric layer on a semiconductor substrate;
   a semiconductor fin extending from the semiconductor substrate, wherein the semiconductor fin is disposed in the dielectric layer;
   a first source region and a first drain region disposed in recesses in the semiconductor fin, wherein the first source region and the first drain region comprise a first epitaxial material, wherein the first source region and the first drain region have sidewalls that are substantially orthogonal to a top surface of the semiconductor substrate;
   a first channel region in the semiconductor fin, wherein the first channel region is laterally between the first source region and the first drain region; and
   a first gate structure over the semiconductor fin, wherein the first gate structure is over the first channel region.

2. The FinFET device of claim 1, wherein the first source region and the first drain region extend above a top surface of the dielectric layer, and wherein top surfaces of the first source region and the first drain region are substantially planar and parallel to the top surface of the semiconductor substrate.

3. The FinFET device of claim 1, wherein the first channel region comprises a second epitaxial material, and wherein the semiconductor fin material adjacent the first channel region comprises a same material as the semiconductor substrate.

4. The FinFET device of claim 3 further comprising:
   a second source region and a second drain region disposed in the semiconductor fin, wherein the second source region and the second drain region comprise a third epitaxial material, the third epitaxial material being different from the first epitaxial material, wherein the second source region and the second drain region have sidewalls that are substantially orthogonal to the top surface of the semiconductor substrate;
   a second channel region in the semiconductor fin, wherein the second channel region is laterally between the second source region and the second drain region, wherein the second channel region comprises a fourth epitaxial material, the fourth epitaxial material being different from the second epitaxial material; and a second gate structure over the semiconductor fin, wherein the second gate structure is over the second channel region.

5. The FinFET device of claim 4, wherein the first channel region has a V-shaped bottom surface extending into the fin, and, wherein the second channel region has a substantially planar bottom surface that is substantially parallel to a top surface of the semiconductor substrate.

6. The FinFET device of claim 5, wherein the first channel region has a shallower depth than the second channel region.

7. The FinFET device of claim 5, wherein the first source region, the first drain region, the first channel region and the first gate structure forms an NMOS FinFET device, and wherein the second source region, the second drain region, the second channel region, and the second gate structure forms a PMOS FinFET device.

8. The FinFET device of claim 3, wherein the first channel region has a V-shaped bottom surface extending into the fin.

9. The FinFET device of claim 3, wherein the first channel region has a substantially planar bottom surface that is substantially parallel to a top surface of the semiconductor substrate.

10. A device comprising:
an isolation layer on a substrate;
a fin extending from the substrate through the isolation layer;
a first set of epitaxial source and drain regions in the fin, wherein the first set of epitaxial source and drain regions have sidewalls that are substantially orthogonal to a top surface of the substrate;
a first epitaxial channel region in the fin, wherein the first epitaxial channel region is laterally between the first set of epitaxial source and drain regions, wherein the material of the fin adjacent the first epitaxial channel region comprises a same material as the substrate; and
a first gate structure over the fin, wherein the first gate structure is over the first epitaxial channel region.

11. The device of claim 10, wherein the first epitaxial channel region has a V-shaped bottom surface extending into the fin.

12. The device of claim 10, wherein the first epitaxial channel region has a substantially planar bottom surface that is substantially parallel to a top surface of the substrate.

13. The device of claim 10 further comprising:
a second set of epitaxial source and drain regions in the fin, wherein the second set of epitaxial source and drain regions have sidewalls that are substantially orthogonal to a top surface of the substrate;
a second epitaxial channel region in the fin, wherein the second channel region is laterally between the second set of source and drain regions, wherein the second epitaxial channel region has a different material composition than the first epitaxial channel region; and
a second gate structure over the fin, wherein the second gate structure is over the second epitaxial channel region.

14. The device of claim 13, wherein the first epitaxial channel region has a V-shaped bottom surface extending into the fin, and wherein the second epitaxial channel region has a substantially planar bottom surface that is substantially parallel to a top surface of the substrate.

15. The device of claim 13, wherein the first epitaxial channel region has a shallower depth than the second epitaxial channel region.

16. The device of claim 13, wherein the first set of source and drain regions, the first gate structure, and the first epitaxial channel region forms an NMOS FinFET device, and wherein the second set of source and drain regions, the second gate structure, and the second epitaxial channel region forms a PMOS FinFET device.

17. The device of claim 10, wherein the first set of epitaxial source and drain regions are in recesses in the fin.

18. A device comprising:
a dielectric layer on a substrate;
a fin extending from the substrate through the dielectric layer, the fin having a top surface over a top surface of the dielectric layer, the fin having sidewalls that extend along a longitudinal axis of the fin;
a first epitaxial source and a first epitaxial drain region in the fin, wherein the first epitaxial source and the first epitaxial drain region have top surfaces over the top surface of the dielectric layer, the first epitaxial source region and the first epitaxial drain region having outermost sidewalls that are substantially coplanar with the sidewalls of the fin;
a first channel region in the fin, wherein the first channel region is laterally between the epitaxial source and drain regions; and
a first gate structure over the fin, wherein the first gate structure is over the first channel region.

19. The device of claim 18, where the first epitaxial source and the first epitaxial drain region each comprise SiGe, Si, SiP, or combinations thereof.

20. The device of claim 18, wherein the first channel region comprises an epitaxial material, the epitaxial material comprising SiGe, Si, SiP, Ge, or combinations thereof.

21. The device of claim 18, wherein the first epitaxial source region and the first epitaxial drain region have sidewalls that are substantially orthogonal to a top surface of the substrate.

22. The device of claim 18, the first epitaxial source region and the first epitaxial drain region are in recesses in the fin.

* * * * *